(12) United States Patent
Hino

(10) Patent No.: US 11,303,836 B2
(45) Date of Patent: Apr. 12, 2022

(54) SOLID-STATE IMAGING DEVICE AND ELECTRONIC EQUIPMENT

(71) Applicant: Sony Semiconductor Solutions Corporation, Kanagawa (JP)

(72) Inventor: Yasufumi Hino, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/281,401

(22) PCT Filed: Oct. 10, 2019

(86) PCT No.: PCT/JP2019/039975
§ 371 (c)(1),
(2) Date: Mar. 30, 2021

(87) PCT Pub. No.: WO2020/090400
PCT Pub. Date: May 7, 2020

(65) Prior Publication Data
US 2022/0046202 A1    Feb. 10, 2022

(30) Foreign Application Priority Data

Nov. 2, 2018    (JP) .............................. JP2018-207536

(51) Int. Cl.
*H04N 5/3745* (2011.01)
(52) U.S. Cl.
CPC ..... *H04N 5/37457* (2013.01); *H04N 5/37455* (2013.01)
(58) Field of Classification Search
None
See application file for complete search history.

(56) References Cited

U.S. PATENT DOCUMENTS

| 2005/0194520 A1 | 9/2005 | Koseki |
| 2016/0212367 A1* | 7/2016 | Utsunomiya .......... H04N 5/374 |
| 2017/0272678 A1 | 9/2017 | Sakakibara et al. |

FOREIGN PATENT DOCUMENTS

| JP | 2005-252529 A | 9/2005 |
| JP | 2010-206356 A | 9/2010 |
| WO | 2016/009832 A1 | 1/2016 |

OTHER PUBLICATIONS

International Search Report (PCT/ISA/210), International Application No. PCT/JP2019/039975, dated Dec. 11, 2019.

(Continued)

*Primary Examiner* — Mark T Monk
(74) *Attorney, Agent, or Firm* — Michael Best & Friedrich LLP

(57) ABSTRACT

Solid-state imaging devices and electronic equipment are disclosed. In one example, a solid-state imaging device includes a pixel array section with pixels that perform photoelectric conversion disposed in an array. A preamplifier section receives pixel signals from the pixels and a threshold signal, and amplifies their differences as differential signals. The preamplifier section is set to a shutdown state on the basis of a first control signal input. A comparator compares the differential signals with a comparison reference signal. A preamplifier through circuit includes switching elements connecting the input terminals of the preamplifier section to input terminals of the comparator section, and sets the switching elements to a connection state on the basis of a second control signal input in the shutdown state. Thus, power consumption can be reduced under conditions that allow characteristics required for the preamplifier section to be moderated.

12 Claims, 14 Drawing Sheets

(56) References Cited

OTHER PUBLICATIONS

Notification of Transmittal of the International Search Report and the Written Opinion of the International Searching Authority, or the Declaration (PCT/ISA/220), International Application No. PCT/JP2019/039975, dated Dec. 24, 2019.
Written Opinion of the International Search Authority (PCT/ISA/237), International Application No. PCT/JP2019/039975, dated Dec. 24, 2019.

* cited by examiner (a) HIGH BIT MODE (b) DURING LOW PIXEL COUNT (a) PREAMPLIFIER ENABLE SIGNAL (b) PREAMPLIFIER CURRENT (c) CLK (a) HIGH BIT MODE (b) DURING LOW PIXEL COUNT

SOLID-STATE IMAGING DEVICE AND ELECTRONIC EQUIPMENT

TECHNICAL FIELD

The present invention relates to a solid-state imaging device and electronic equipment.

BACKGROUND ART

In recent years, solid-state imaging devices such as CMOS (Complementary Metal Oxide Semiconductor) image sensors to which semiconductor micromachining technology is applied have been widely adopted for digital cameras, smartphones, and the like.

In these solid-state imaging devices, a photodiode provided in each pixel as a photoelectric conversion element photoelectrically converts light incident from a subject, and a voltage signal corresponding to the amount of charge obtained is read out via an amplification transistor and a vertical signal line. The voltage signal is then subjected to analog/digital (A/D) conversion by an A/D converter with a comparator, and imaging data is output.

Incidentally, in a case where an imaging apparatus using an imaging device such as a CMOS performs a sequential-conversion-type A/D conversion, a comparator used in a sequential-conversion-type A/D conversion circuit generally includes a dynamic comparator with high power efficiency.

However, the dynamic comparator involves a large kick back noise amount, and in a case where a large number of A/D conversion circuits are used and simultaneously operated as in an imaging device, the dynamic comparator may suffer from streaking due to common impedance for a power supply, a ground, a reference, and the like.

For prevention of streaking, for example, a technique described in PTL 1 has been proposed.

CITATION LIST

Patent Literature

[PTL 1]
JP 2005-252529A

SUMMARY

Technical Problem

Incidentally, in a case where a preamplifier is provided preceding the dynamic comparator in order to achieve a high resolution, the preamplifier requires high linearity and excellent noise characteristics. The preamplifier with high linearity and excellent noise characteristics involves high power consumption.

In view of such circumstances, an object of the present disclosure is to provide a solid-state imaging device and electronic equipment in which, in a case where no preamplifier is required that is provided preceding a dynamic converter, a short circuit is formed between an input and an output of a preamplifier, which is thus powered down, and in which the dynamic comparator directly performs a comparison, enabling a reduction in power consumption.

In view of such circumstances, an object of the present disclosure is to provide a solid-state imaging device and electronic equipment in which linearity or noise characteristics and an intermittence rate of a preamplifier provided preceding a dynamic comparator are changed depending on an intended use, thus enabling a reduction in power consumption.

Solution to Problem

In order to accomplish the above-described objects, a solid-state imaging device of the present disclosure includes a pixel array section in which a plurality of pixels is disposed in an array, the plurality of pixels performing photoelectric conversion and outputting respective pixel signals, a preamplifier section including respective input terminals to which the pixel signals and a threshold signal are input, the preamplifier section amplifying differences between the pixel signals and the threshold signal and outputting the amplified differences as differential signals, the preamplifier section being set to a shutdown state on the basis of a first control signal input, a comparator section comparing the differential signals and outputting comparison result data, and a preamplifier through circuit including a plurality of switching elements connecting the input terminals of the preamplifier section to input terminals of the comparator section, the preamplifier through circuit setting the switching elements to a connection state on the basis of a second control signal input in the shutdown state.

According to the present disclosure, the preamplifier section is set to the shutdown state on the basis of the first control signal input. At this time, the preamplifier through circuit sets the switching elements to the connection state on the basis of the second control signal input in the shutdown state. This allows the comparator section to operate without using the preamplifier section, enabling suppression of power consumption.

Advantageous Effects of Invention

According to the present disclosure, under conditions that enable moderation of the linearity and characteristics regarding noise or the like required for the preamplifier section, a reduced current in the preamplifier section allows power consumption to be suppressed. In addition, under conditions in which only a small number of bits are required for an A/D conversion, the number of conversions can be reduced, and thus, an increased intermittence rate allows power consumption to be suppressed. Note that effects described here are not necessarily restrictive and that any of the effects described in the present disclosure may be produced.

DESCRIPTION OF EMBODIMENTS

Embodiments of the present disclosure will be described below on the basis of the drawings. Note that, in the embodiments described below, similar portions are assigned the same reference signs, and duplicate descriptions are omitted.

(1) First Embodiment

[Configuration Example of Electronic Equipment]

Figure 1:
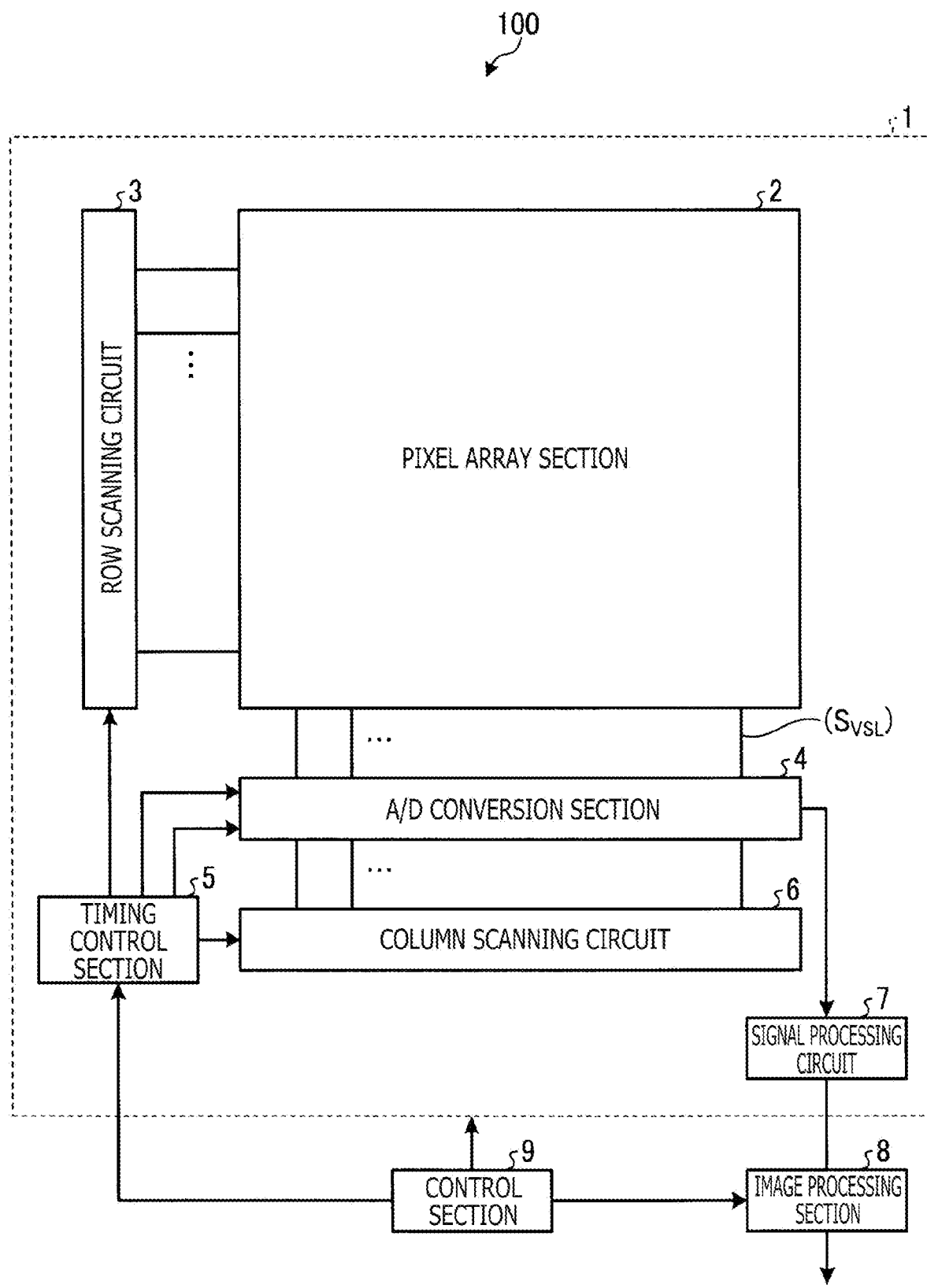
FIG. 1 is a block diagram illustrating a configuration example of a solid-state imaging device in an embodiment.

FIG. 1 is a block diagram illustrating a configuration example of electronic equipment in ab embodiment.

Electronic equipment 100 generally includes a solid-state imaging device 1, an image processing section 8, and a control section 9.

The solid-state imaging device 1 includes a pixel array section 2, a row scanning circuit 3, an A/D conversion section 4, a timing control section 5, a column scanning circuit 6, and a signal processing circuit 7.

In the configuration described above, the pixel array section 2 is provided with a plurality of scanning lines and a plurality of signal lines. A pixel circuit is disposed at each of intersection portions between the scanning lines and the signal lines, and thus a plurality of pixel circuits is provided in a two-dimensional grid shape. In the row scanning circuit 3, under the control of the timing control section 5, any of the plurality of scanning lines is set to an active state to drive a pixel circuit for one row constituting the pixel array section 2 and corresponding to the scanning line set to the active state. Thus, the pixel circuit is caused to output a pixel signal.

Meanwhile, the A/D conversion section 4 includes a plurality of A/D converters described below, and performs a voltage A/D conversion corresponding to the input pixel signal and outputs pixel data to the signal processing circuit 7.

Under the control of the control section 9, the timing control section 5 controls timings at which each of the row scanning circuit 3, the A/D conversion section 4, and the column scanning circuit 6 operates.

Under the control of the timing control section 5, the column scanning circuit 6 operates in synchronism with operations of the row scanning circuit 3 and the A/D conversion section 4, and the A/D conversion section 4 sequentially transfers data resulting from the A/D conversion for each signal line to the signal processing circuit 7 as pixel data.

The signal processing circuit 7 executes processing such as automatic gain control, noise cancellation, and the like on image data including a plurality of pieces of pixel data, and outputs the image data processed to the image processing section 8, located outside.

Under the control of the control section 9, the image processing section 8 executes various types of image processing on the image data.

The image processing includes, for example, execution of demosaic processing, white balance processing, and the like.

The image data resulting from the image processing is transmitted to a recording apparatus such as an external image memory.

In the above description, the image processing section 8 is disposed outside the solid-state imaging device 1. However, the image processing section 8 can also be provided inside the solid-state imaging device 1.

In addition, the circuits within the solid-state imaging device 1 may be disposed on a single semiconductor substrate or disposed in a distributed manner on a plurality of semiconductor substrates laminated on top of another.

[Configuration Example of A/D Converter]

Figure 2:
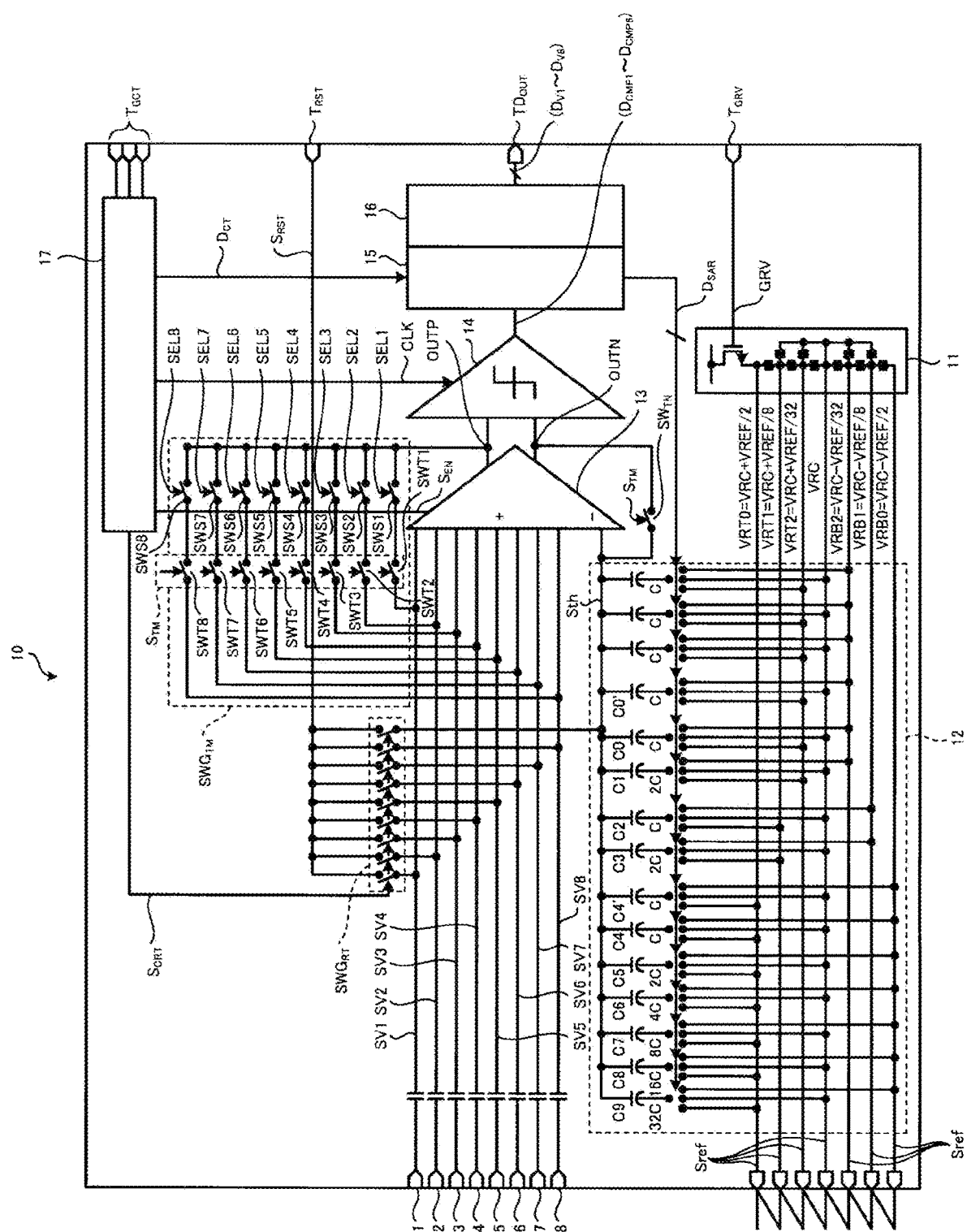
FIG. 2 is a diagram illustrating a configuration example of an A/D converter of a first embodiment.

FIG. 2 is a diagram illustrating a configuration example of an A/D converter of the first embodiment.

Being broadly classified into main components, an A/D converter 10 includes a local reference voltage generation section 11, a DA conversion section 12, a preamplifier section 13, a comparator section 14, a sequential conversion logic section 15, a column interface section 16, a clock generation/logic control block 17, and a preamplifier through switch groups $SWG_{TM}$ and $SW_{TN}$, as illustrated in FIG. 2.

The local reference voltage generation section 11 generates a plurality of types of local reference voltage signals (local reference voltages) VRT0, VRT1, VRT2, VRC, VRB2, VRB1, and VRB0 from a reference voltage $T_{GRV}$.

In this case, assuming that the voltage of the local reference signal VRC is VRC (=central voltage) and that a predetermined reference voltage is VREF, the voltages of the local reference voltage signals VRT0, VRT1, VRT2, VRT2, VRB2, VRB1, and VRB0 are set as illustrated below.

$VRT0=VRC+VREF/2$ $VRT1=VRC+VREF/8$ $VRT2=VRC+VREF/32$ $VRB2=VRC-VREF/32$ $VRB1=VRC-VREF/8$ $VRB0=VRC-VREF/2$

The DA conversion section 12 uses a plurality of types of local reference signals Sref generated by the local reference voltage generation section 11 to perform a digital/analog (D/A) conversion on control data $D_{SAR}$ under the control of the sequential conversion logic section 15 described below. The DA conversion section 12 then outputs a threshold voltage signal $S_{th}$.

The preamplifier section 13 amplifies differential voltages between the threshold voltage signal St; and pixel signals $SV_1$ to $SV_8$ input from the pixel array section 2 through pixel signal input terminals TV1 to TV8 via a coupling capacitor, and outputs amplified activation signals to output signal lines OUTP and OUTN.

The comparator section 14 compares preamplifier output signals OUTP and OUTN with each other and outputs comparison result data $D_{CMP}$.

Under the control of the clock generation/logic control block 17, the sequential conversion logic section 15 outputs the control data $D_{SAR}$ of the digital/analog conversion section from the comparison result data $D_{CMP}$. In addition, the sequential conversion logic section 15 stores the input comparison result data $D_{CMP}$, and on the basis of the stored comparison result data $D_{CMP}$, outputs pixel data corresponding to an analog/digital (A/D) conversion result for the pixel signal.

The column interface section 16 outputs, from an output terminal $TD_{OUT}$ at predetermined output timings, pieces of pixel data $D_{V1}$ to $D_{V8}$ corresponding to analog/digital (A/D) conversion results for pixel signals TV1 to TV8.

The clock generation/logic control block 17 supplies a comparison signal CLK to the comparator section 14 and supplies an enable signal $S_{EN}$ to the preamplifier section 13. In addition, the clock generation/logic control block 17 supplies control signals $S_{TM}$ and SEL1 to SEL8 for switching of a preamplifier through mode. In this regard, the enable signal $S_{EN}$ functions as a first control signal, and a through mode control signal $S_{TM}$ and pixel selection signals SEL1 to SEL8 function as second control signals.

The preamplifier through switch group $SWG_{TM}$ includes a plurality of switching elements SWT1 to SWT8 and SWS1 to SWS8 that use the through mode control signal $S_{TM}$ and the pixel selection signals SEL1 to SEL8 to guide the pixel signals SV1 to SV8 input from the signal input terminals TV1 to TV8 via the coupling capacitor, directly to the comparator section 14 without the intervention of the preamplifier section 13.

In the configuration described above, the through mode control signal $S_{TM}$ is output to each of the switching elements SWT1 to SWT8 and $SW_{TN}$.

In addition, the preamplifier through switch group $SWG_{TM}$ includes a plurality of switching elements SWS1 to SWS8 that are exclusively set to an on state (closed state) by corresponding selection signals SEL1 to SEL8 input to the switching elements SWS1 to SWS8 in a case where the preamplifier section 13 is operated in the preamplifier through mode described below, the switching elements SWS1 to SWS8 then sequentially guiding any of the input pixel signals SV1 to SV8 directly to the comparator section 14 without the intervention of the preamplifier section 13.

In this regard, the preamplifier through switch group $SWG_{TM}$, the plurality of switching elements SWT1 to SWT8 and $SW_{TN}$, and the plurality of switching elements SWS1 to SWS8 constitute a preamplifier through circuit.

In FIG. 2, the plurality of switching elements SWT1 to SWT8 are illustrated at positions where the switching elements SWT1 to SWT8 are spaced apart from signal lines respectively leading from the pixel signal input terminals SV1 to SV8 to the preamplifier section 13. However, in actuality, the switching elements SWT1 to SWT8 are provided in the vicinity of the signal lines leading to the preamplifier section 13 in order to reduce the adverse effect of wiring capacitance of bypassing wiring for the switching elements SWT1 to SWT8.

Likewise, the plurality of switching elements SWS1 to SWS8 are illustrated at positions where the switching elements SWS1 to SWS8 are spaced apart from an output signal line OUTP. However, in actuality, the switching elements SWS1 to SWS8 are provided in the vicinity of the output signal line OUTP in order to reduce the adverse effect of wiring capacitance of bypassing wiring for the switching elements SWS1 to SWS8.

Note that, in the above description, the preamplifier through switch group $SWG_{TM}$ includes both the switching elements SWT1 to SWT8 and $SW_{TN}$ and the switching elements SWS1 to SWS8 but that similar effects can also be obtained by providing only one of the set of switching elements SWT1 to SWT8 and the set of switching elements SWS1 to SWS8 and sequentially exclusively setting the plurality of switching elements provided to the on state (closed state) in a case where the preamplifier section 13 is operated in the preamplifier through mode described below.

In addition, in the above description, the one switching element $SW_{TN}$ is provided on a threshold voltage terminal side of the preamplifier section 13 as a preamplifier through switch. However, instead of this, two series-connected switching elements can be provided and configured to reduce the wiring capacitance for a reason similar to the reason described above.

A reset switch group $SWG_{RT}$ includes a plurality of switching elements setting a preamplifier input voltage to an initial voltage VSET (=the potential level of a reset signal $S_{RST}$ input from a reset signal input terminal TRST).

[Detailed Configuration of Preamplifier Section and Comparator Section According to First Embodiment]

Figure 3:
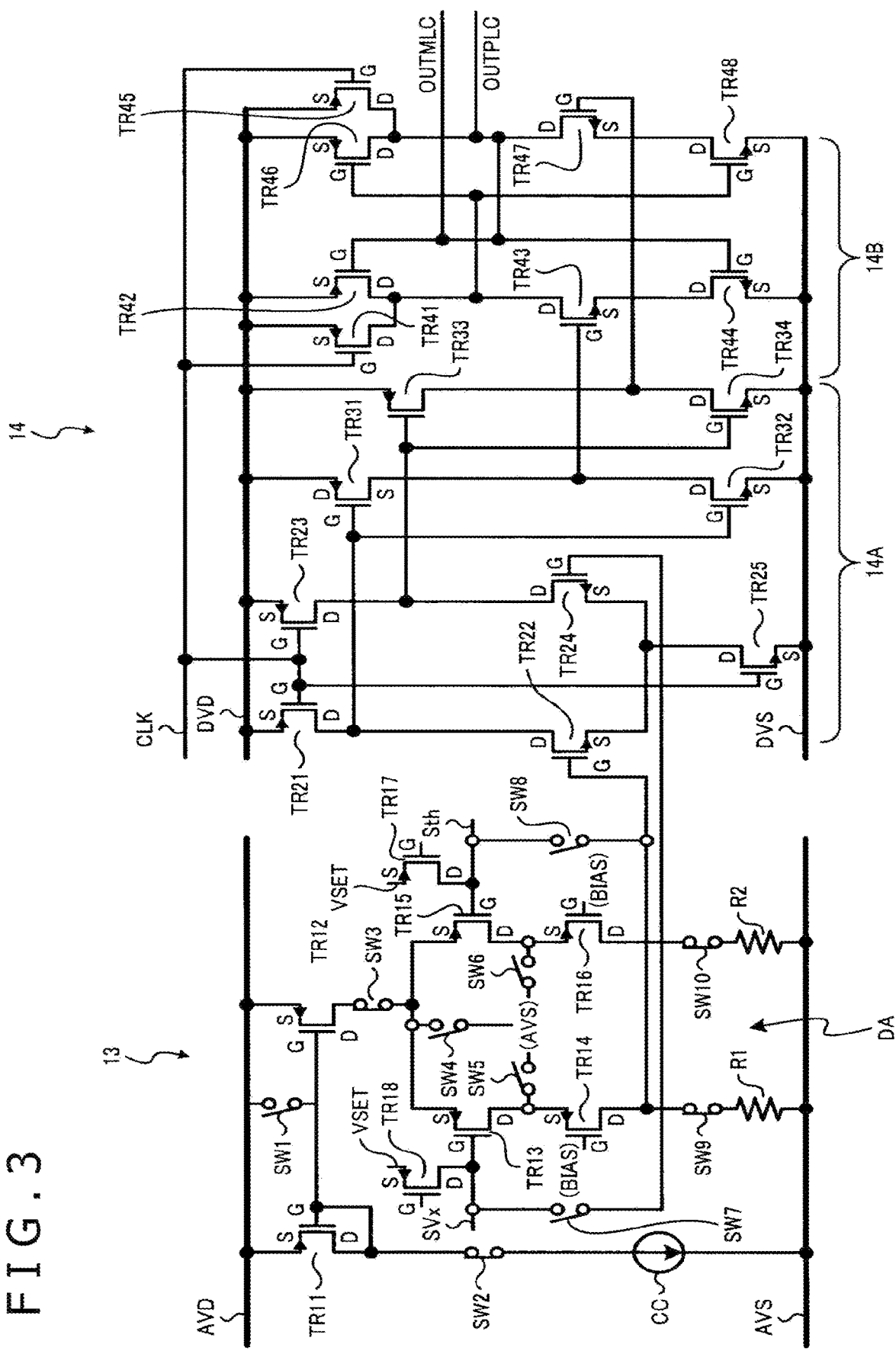
FIG. 3 is a detailed configuration diagram of a preamplifier section and a comparator section according to the first embodiment.

FIG. 3 is a detailed configuration diagram of an example of a preamplifier section and a comparator section according to a first embodiment.

FIG. 3 illustrates a case in which the preamplifier section 13 is of a PMOS input type.

The preamplifier section 13 includes a P channel MOS transistor TR11 including a source terminal S connected to a power supply line AVD, a gate terminal G, and a drain terminal D connected to the gate terminal G for diode connection, a P channel MOS transistor TR12 including a source terminal S connected to the power supply line AVD and a gate terminal G connected to the gate terminal G of the P channel MOS transistor TR11 and functioning with the P channel MOS transistor TR11 as a current mirror circuit, and a constant current source CC connected at one end to the drain terminal D of the P channel MOS transistor TR11 and connected at the other end to a ground line AVS.

In addition, the preamplifier section 13 includes a P channel MOS transistor TR13 including a gate terminal G to which a pixel signal $SV_x$ is input and a source terminal S connected to a drain terminal of the P channel MOS transistor TR12, a P channel MOS transistor TR14 including a source terminal S connected to a drain terminal D of the P channel MOS transistor TR13 and a gate terminal G to which an operating voltage BIAS is input and functioning as a cascode circuit, and a load resistor R1 connected at one end to a drain terminal D of the P channel MOS transistor TR14 and connected at the other end to the ground line AVS.

Further, the preamplifier section 13 includes a P channel MOS transistor TR15 including a gate terminal G to which the threshold voltage signal $S_{th}$ is input and a source terminal S connected to the drain terminal D of the P channel MOS transistor TR12, a P channel MOS transistor TR16 including a source terminal S connected to a drain terminal D of the P channel MOS transistor TR15 and a gate terminal G to which the operating voltage BIAS is input and functioning as a cascode circuit, and a load resistor R2 connected at one end to a drain terminal D of the P channel MOS transistor TR16 and connected at the other end to the ground line AVS.

In addition, the preamplifier section 13 includes a P channel MOS transistor TR17 for applying an initial voltage VSET to the P channel MOS transistor TR15, and a P channel MOS transistor TR18 for applying the initial voltage VSET to the P channel MOS transistor TR13.

In addition, the preamplifier section 13 includes switching elements SW1 to SW10 described below, for the time of the preamplifier through mode.

Specifically, the preamplifier section 13 includes a switching element SW1 for connecting the gate terminal G of the P channel MOS transistor TR11 and the gate terminal G of the P channel MOS transistor TR12 to the power supply line AVD during the preamplifier through mode, a switching element SW2 for disconnecting the drain terminal D of the P channel MOS transistor TR11 from the constant current source CC, and a switching element SW3 for disconnecting the drain terminal D of the P channel MOS transistor TR12 from the source terminals S of the P channel MOS transistors TR13 and TR15.

Further, the preamplifier section 13 includes a switching element SW4 for connecting the source terminals S of the P channel MOS transistors TR13 and TR15 to the ground line AVS, and switching elements SW5 and SW6 for connecting the drain terminals D of the P channel MOS transistors TR13 and TR15 to the ground line AVS.

Still further, the preamplifier section 13 includes a switching element SW7 for connecting the gate terminal G of the P channel MOS transistor TR13 to one of the input terminals of the comparator section 14, a switching element SW8 for connecting the gate terminal G of the P channel MOS transistor TR15 to the other input terminal of the comparator section 14, a switching element SW9 for disconnecting the load resistor R1 from the drain terminal D of the P channel MOS transistor TR14, and a switching element SW10 for disconnecting the load resistor R2 from the drain terminal D of the P channel MOS transistor TR16.

In addition, the P channel MOS transistor TR13, the P channel MOS transistor TR14, the P channel MOS transistor TR15, the P channel MOS transistor TR16, the load resistor R1, and the load resistor R2 constitute a differential amplifier DA.

Figure 4:
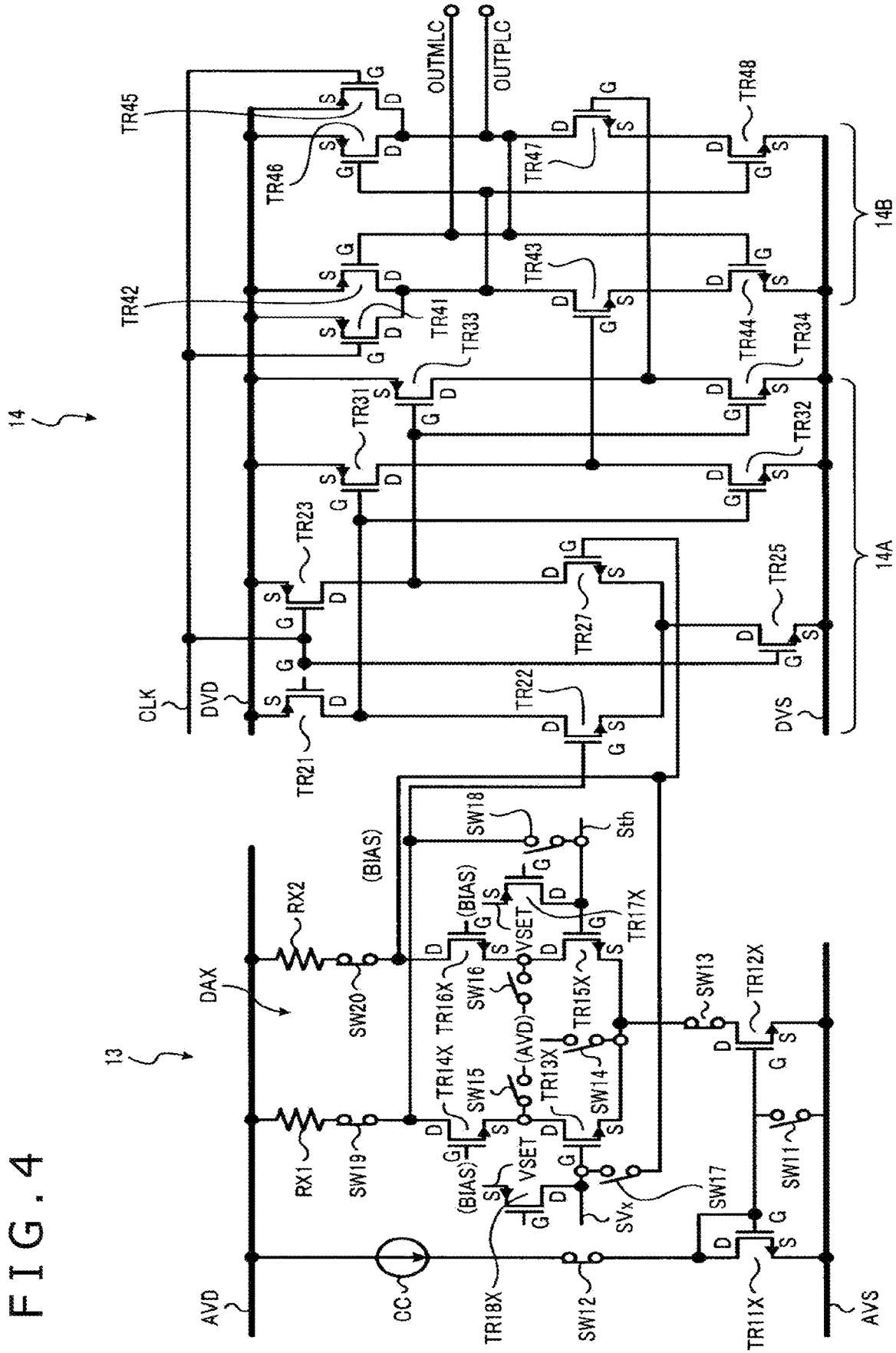
FIG. 4 is another detailed configuration diagram of the preamplifier section and the comparator section according to the first embodiment.

FIG. 4 is a detailed configuration diagram of another example of the preamplifier section and the comparator section according to the first embodiment.

FIG. 4 illustrates a case in which the preamplifier section 13 is of an NMOS input type.

The preamplifier section 13 includes an N channel MOS transistor TR11X including a source terminal S connected to the ground line AVS, a gate terminal G, and a drain terminal D diode-connected to the gate terminal G, an N channel MOS transistor TR12X including source terminal S connected to the ground line AVS and a gate terminal G connected to the gate terminal G of the N channel MOS transistor TR11X and functioning with the N channel MOS transistor TR11X as a current mirror circuit, and a constant current source CC connected at one end to a drain terminal D of the N channel MOS transistor TR11A and connected at the other end to the power supply line AVD.

In addition, the preamplifier section 13 includes an N channel MOS transistor TR13X including a gate terminal G to which the pixel signal $SV_x$ is input and a source terminal S connected to a drain terminal D of the N channel MOS transistor TR12X, an N channel MOS transistor TR14X including a source terminal S connected to a drain terminal D of the N channel MOS transistor TR13X and a gate terminal G to which the operating voltage BIAS is input and functioning as a cascode circuit, and a load resistor RX1 connected at one end to a drain terminal D of the N channel MOS transistor TR14X and connected at the other end to the power supply line AVD.

Further, the preamplifier section 13 includes an N channel MOS transistor TR15X including a gate terminal G to which the threshold voltage signal $S_{th}$ is input and a source terminal S connected to the drain terminal D of the N channel MOS transistor TR12X, an N channel MOS transistor TR16X including a source terminal S connected to a drain terminal D of the N channel MOS transistor TR15X and a gate terminal G to which the operating voltage BIAS is input and functioning as a cascode circuit, and a load resistor RX2 connected at one end to a drain terminal D of the N channel MOS transistor TR16X and connected at the other end to the power supply line AVD.

In addition, the preamplifier section 13 includes a P channel MOS transistor TR18X for applying the initial voltage VSET to the N channel MOS transistor TR13X, and a P channel MOS transistor TR17X for applying the initial voltage VSET to the P channel MOS transistor TR15X.

In addition, the preamplifier section 13 includes switching elements SW11 to SW20 described below, for the time of the preamplifier through mode.

Specifically, the preamplifier section 13 includes a switching element SW11 for connecting the gate terminal G of the N channel MOS transistor TR11X and the gate terminal G of the N channel MOS transistor TR12X to the ground line AVS during the preamplifier through mode, a switching element SW12 for disconnecting the drain terminal D of the N channel MOS transistor TR11X from the constant current source CC during the preamplifier through mode, and a switching element SW13 for disconnecting the drain terminal D of the N channel MOS transistor TR12X from the source terminal S of the N channel MOS transistor TR15X during the preamplifier through mode.

Further, the preamplifier section 13 includes a switching element SW14 for connecting the source terminal S of the N channel MOS transistor TR13X and the source terminal S of the N channel MOS transistor TR15X to the power supply line AVD during the preamplifier through mode, a switching element SW15 for connecting the drain terminal D of the N channel MOS transistor TR13X to the power supply line AVD during the preamplifier through mode, and a switching element SW16 for connecting the drain terminal D of the N channel MOS transistor TR15X to the power supply line AVD during the preamplifier through mode.

Still further, the preamplifier section 13 includes a switching element SW17 for connecting the gate terminal G of the N channel MOS transistor TR13 to one of the input terminals of the comparator section 14, a switching element SW18 for connecting the gate terminal G of the N channel MOS transistor TR15X to the other input terminal of the comparator section 14, a switching element SW19 for disconnecting the load resistor RX1 from the drain terminal D of the P channel MOS transistor TR14X during the preamplifier through mode, and a switching element SW20 for disconnecting the load resistor RX2 from the drain terminal D of the N channel MOS transistor TR16X during the preamplifier through mode.

In addition, the N channel MOS transistor TR13X, the N channel MOS transistor TR14X, the N channel MOS transistor TR15X, the N channel MOS transistor TR16X, the load resistor RX1, and the load resistor RX2 constitute a differential amplifier DAX.

Figure 5:
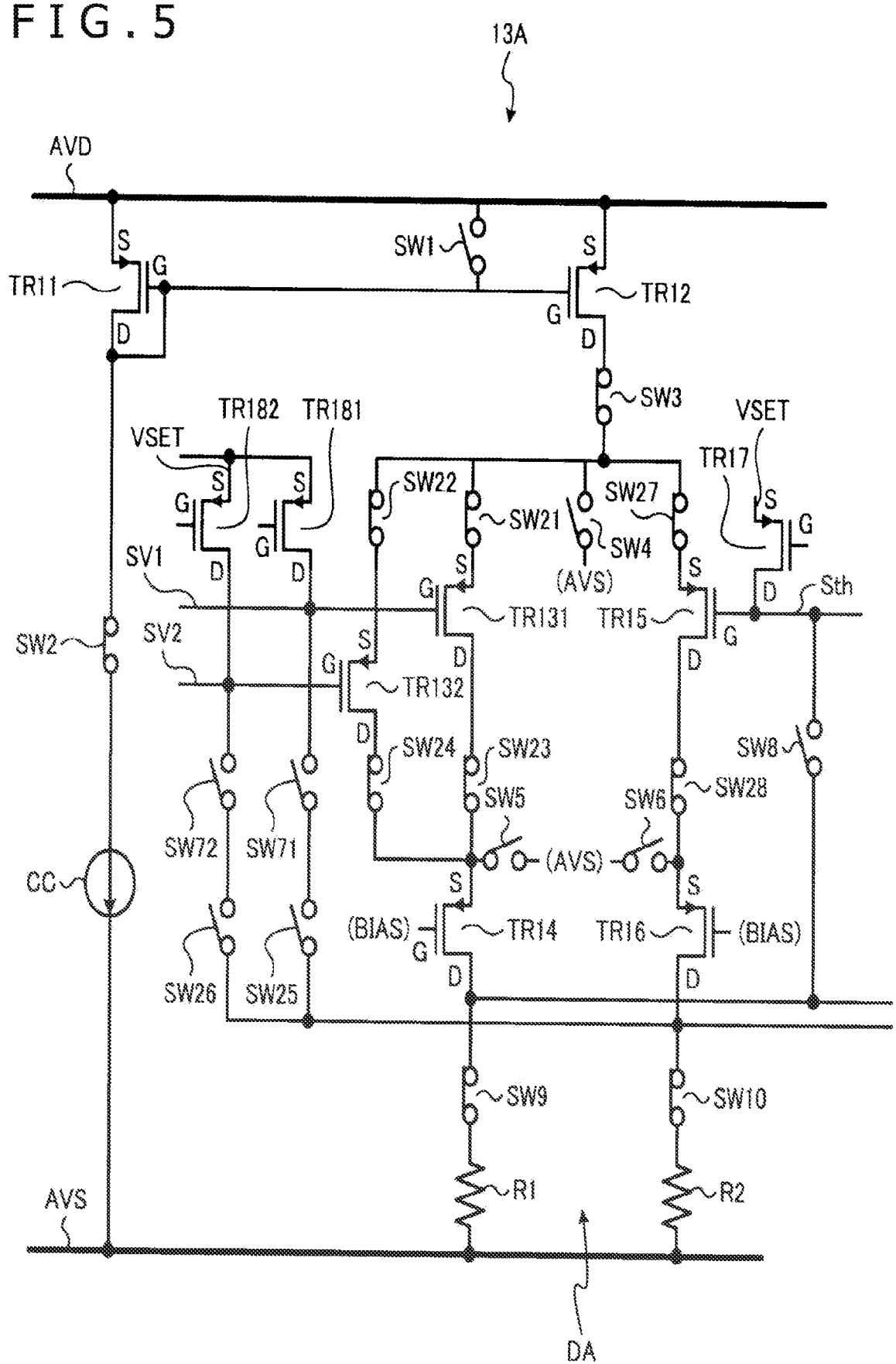
FIG. 5 is a detailed configuration diagram corresponding to two pixel signals in the preamplifier section of the first embodiment.

FIG. 5 is a detailed configuration diagram corresponding to two pixel signals in the preamplifier section of the first embodiment.

FIG. 5 illustrates a case in which a preamplifier section 13A is of a PMOS input type. In this example, only two of the pixel signals, the pixel signal SV1 and the pixel signal SV2, are illustrated for facilitation of understanding and simplification of illustration.

In FIG. 5, portions similar to the corresponding portions of the preamplifier section 13 are assigned the same reference signs.

The preamplifier section 13A includes the P channel MOS transistor TR11 including the source terminal S connected to the power supply line AVD, the gate terminal G, and the drain terminal D connected to the gate terminal G for diode connection, the P channel MOS transistor TR12 including the source terminal S connected to the power supply line AVD and the gate terminal G connected to the gate terminal G of the P channel MOS transistor TR11 and functioning with the P channel MOS transistor TR11 as a current mirror circuit, and the constant current source CC connected at one end to the drain terminal D of the P channel MOS transistor TR11 and connected at the other end to the ground line AVS.

In addition, the preamplifier section 13A includes a P channel MOS transistor TR131 including a gate terminal G to which the pixel signal SV1 is input and a source terminal S connected to the drain terminal D of the P channel MOS transistor TR12, a P channel MOS transistor TR132 including a gate terminal G to which the pixel signal SV2 is input and a source terminal S connected to the drain terminal D of the P channel MOS transistor TR12, the P channel MOS transistor TR14 including a source terminal S connected to a drain terminal D of the P channel MOS transistor TR131 or a drain terminal D of the P channel MOS transistor TR132 and a gate terminal G to which the operating voltage BIAS is input and functioning as a cascode circuit, and the load resistor R1 connected at one end to the drain terminal D of the P channel MOS transistor TR14 and connected at the other end to the ground line AVS.

Further, the preamplifier section 13A includes the P channel MOS transistor TR15 including the gate terminal G to which the threshold voltage signal $S_{th}$ is input and the source terminal S connected to the drain terminal D of the P channel MOS transistor TR12, the P channel MOS transistor TR16 including the source terminal S connected to the drain terminal D of the P channel MOS transistor TR15 and the gate terminal G to which the operating voltage BIAS is input and functioning as a cascode circuit, and the load resistor R2 connected at one end to the drain terminal D of the P channel MOS transistor TR16 and connected at the other end to the ground line AVS.

In addition, the preamplifier section 13A includes the P channel MOS transistor TR17 for applying the initial voltage VSET to the P channel MOS transistor TR15, a P channel MOS transistor TR181 for applying the initial voltage VSET to the P channel MOS transistor TR131, and a P channel MOS transistor TR182 for applying the initial voltage VSET to the P channel MOS transistor TR132.

In addition, the preamplifier section 13A includes switching elements SW1 to SW6, SW71, SW72, and SW8 to SW10 described below, for the time of the preamplifier through mode.

Specifically, the preamplifier section 13A includes the switching element SW1 for connecting the gate terminal G of the P channel MOS transistor TR11 and the gate terminal G of the P channel MOS transistor TR12 to the power supply line AVD during the preamplifier through mode, the switching element SW2 for disconnecting the drain terminal D of the P channel MOS transistor TR11 from the constant current source CC during the preamplifier through mode, and the switching element SW3 for disconnecting the drain terminal D of the P channel MOS transistor TR12 from the source terminals S of the P channel MOS transistors TR15, TR131, and TR132 during the preamplifier through mode.

Further, the preamplifier section 13A includes the switching element SW4 for connecting the source terminals S of the P channel MOS transistors TR131 and TR132 and the source terminal S of the P channel MOS transistor TR15 to the ground line AVS during the preamplifier through mode, the switching element SW5 for connecting the drain terminals D of the P channel MOS transistors TR131 and TR132 to the ground line AVS during the preamplifier through mode, and the switching element SW6 for connecting the drain terminal D of the P channel MOS transistor TR15 to the ground line AVS during the preamplifier through mode.

Still further, the preamplifier section 13A includes switching elements SW71 and SW25 for connecting the gate terminal G of the P channel MOS transistor TR131 to one of the input terminals of the comparator section 14, switching elements SW72 and SW26 for connecting the gate terminal G of the P channel MOS transistor TR132 to the one of the input terminals of the comparator section 14, the switching element SW8 for connecting the gate terminal G of the P channel MOS transistor TR15 to the other input terminal of the comparator section 14, the switching element SW9 for disconnecting the load resistor R1 from the drain terminal D of the P channel MOS transistor TR14 during the preamplifier through mode, and the switching element SW10 for disconnecting the load resistor R2 from the drain terminal D of the P channel MOS transistor TR16 during the preamplifier through mode.

In the present example as well, one of the P channel MOS transistor TR131 or the P channel MOS transistor TR132 that is connected, the P channel MOS transistor TR14, the P channel MOS transistor TR15, the P channel MOS transistor TR16, the load resistor R1, and the load resistor R2 constitute the differential amplifier DA.

[Circuit Configuration Example of Comparator Section]

Now, a circuit configuration example of the comparator section 14 will be described.

As illustrated in FIG. 3, being broadly classified into main components, the comparator section 14 includes an amplification section (amplification stage) 14A and a latch section 14B.

The amplification section 14A includes a P channel MOS transistor TR21 including a source terminal S connected to a digital power supply DVD and a gate terminal G connected to a clock signal line CLK, an N channel MOS transistor TR22 including a drain terminal D connected to a drain terminal D of the P channel MOS transistor TR21 and a gate terminal G connected to a positive-side input terminal INP, a P channel MOS transistor TR23 including a source terminal S connected to the digital power supply DVD and a gate terminal G connected to the clock signal line CLK, an N channel MOS transistor TR24 including a drain terminal D connected to a drain terminal D of the P channel MOS transistor TR23 and a gate terminal G connected to a negative-side input terminal INN, and an N channel MOS transistor TR25 including a drain terminal D connected to both source terminal S of the N channel MOS transistor TR22 and source terminal S of the N channel MOS transistor TR24, a gate terminal G connected to the clock signal line CLK, and a source terminal S connected to the digital ground DVS.

In addition, the amplification section 14A includes a P channel MOS transistor TR31 and an N channel MOS transistor TR32 constituting a CMOS inverter, and a P channel MOS transistor TR33 and an N channel MOS transistor TR34 constituting a CMOS inverter, and cooperation of these transistors amplifies signals.

The latch section 14B includes a P channel MOS transistor TR41 including a source terminal S connected to the digital power supply DVD and a gate terminal G connected to the clock signal line CLK, a P channel MOS transistor TR42 including a source terminal S connected to the digital power supply DVD and a drain terminal D connected to a drain terminal D of the P channel MOS transistor TR41, an N channel MOS transistor TR43 including a drain terminal D connected to a drain terminal D of the P channel MOS transistor TR41 and a drain terminal D of the P channel MOS transistor TR42 and a gate terminal G connected to a source terminal S of the P channel MOS transistor TR31 and a drain terminal D of the N channel MOS transistor TR32, and an N channel MOS transistor TR44 including a drain terminal D connected to a source terminal S of the N channel MOS transistor TR43, a source terminal S connected to the digital ground DVS, and a gate terminal G connected to a gate terminal G of the P channel MOS transistor TR42.

In addition, the latch section 14B includes a P channel MOS transistor TR45 including a source terminal S connected to the digital power supply DVD and a gate terminal G connected to the clock signal line CLK, a P channel MOS transistor TR46 including a source terminal S connected to the digital power supply DVD, a drain terminal D connected to a drain terminal D of the P channel MOS transistor TR45, and a gate terminal G connected to the drain terminal D of the P channel MOS transistor TR42 and the drain terminal D of the N channel MOS transistor TR43, an N channel MOS transistor TR47 including a drain terminal D connected to a drain terminal D of the P channel MOS transistor TR45 and a drain terminal D of the P channel MOS transistor TR46 and a gate terminal G connected to a source terminal S of the P channel MOS transistor TR33 and a drain terminal D of the N channel MOS transistor TR34, the P channel MOS transistor TR33 and the N channel MOS transistor TR34 constituting the inverter, and an N channel MOS transistor TR48 including a drain terminal D connected to a source terminal S of the N channel MOS transistor TR47, a source terminal S connected to the digital ground DVS, and a gate terminal G connected to the gate terminal G of the P channel MOS transistor TR46.

[General Operation During Normal Operation of A/D Converter]

Now, general operation during normal operation of the A/D converter 10 will be described.

The A/D converter 10 performs sequential comparison on pixel data corresponding to an A/D conversion result from the most significant bit to the least significant bit to set values ("1" or "0") for all the bits.

First, the sequential conversion logic section 15 sets each of all voltages to a center voltage (VRC) as an initial value.

The preamplifier section 13 amplifies a difference between the threshold voltage signal $S_{th}$ and the pixel signals SVX input from a pixel signal input terminal TVX (X=1 to 8) to generate differential signals OUTP and OUTN and outputs the differential signals OUTP and OUTN to the comparator section 14.

The comparator section 14 compares the voltages of the differential signals OUTP and OUTN with each other and outputs the comparison result data $D_{CMPX}$ to the sequential conversion logic section 15.

The sequential conversion logic section 15 generates control data $D_{SAR}$ for the DA conversion section 12 according to the result in the comparison result data $D_{CMP}$, and stores the comparison result data $D_{CMP}$.

The DA conversion section 12 uses a plurality of types of local reference voltages VRT0 to VRT2, VRC, and VRB0 to VRB2 generated by the local reference voltage generation section 11 to perform a digital/analog (D/A) conversion on the input control data $D_{SAR}$, and outputs the threshold voltage signal $S_{th}$ to the preamplifier section 13.

Subsequently, the DA conversion section 12 similarly performs sequential comparison from the most significant bit (MSB) to the least significant bit (LSB), and the sequential conversion logic section 15 determines and stores the value of each bit. Then, once the values of all the bits are determined, the stored data is output from an output terminal $TD_{OUT}$ as A/D conversion result data $D_{V1}$ to $D_{V8}$.

[General Operation of A/D Converter During Preamplifier Through Mode]

Now, general operation of the A/D converter during the preamplifier through mode will be described.

First, preamplifier through mode will be described.

In the configuration of the A/D converter 10, with a low resolution (a low pixel count), one LSB has an increased value, thus moderating requirements regarding quantization errors and streaking characteristics. This allows the comparator section 14 to deliver sufficient performance without using the preamplifier section 13. For reduced power consumption, a configuration is adopted in which the pixel signals SV1 to SV8 input from the pixel signal input terminals TV1 to TV8 and the threshold voltage $S_{th}$ bypass the amplification and are fed to the comparator section 14.

As a result, when the pixel signals SV1 to SV8 and the threshold voltage $S_{th}$ bypass the amplification, transitioning to a power down mode occurs in which the preamplifier section 13 stops operation. This reduces power consumption in the imaging device 1 and thus in the whole electronic equipment 100.

Specifically, one of the combinations of the switching elements SWT1 to SWT8 and the switching elements SWS1 to SWS8 is set to the on state (closed state) to form a signal path through which the pixel signals SV1 to SV8 input from the pixel signal input terminals TV1 to TV8 can bypass the preamplifier section 13.

In addition, for the threshold voltage $S_{th}$, the switching element $SW_{TN}$ is set to the on state (closed state) to form a signal path through which the threshold voltage $S_{th}$ can bypass the preamplifier section 13. When the preamplifier section 13 is bypassed, the preamplifier section 13 is electrically blocked to enable only a signal path extending through the switching elements SWT1 to SWT8 and the switching elements SWS1 to SWS8 and a signal path extending through the switching element $SW_{TN}$, the pixel signals $SV_1$ to $SV_8$ and the threshold voltage $S_{th}$ bypass the preamplifier section 13 and are directly fed to the comparator section 14. Only the portion of the bypass path in which the A/D conversion is executed is set to the on state (closed state).

[Internal Operation of Preamplifier Section During Preamplifier Through Mode]

Now, internal operation of the preamplifier section 13 during the preamplifier through mode will be described.

In the preamplifier through mode, the switching element SW1 is set to the on state (closed state) to connect the gate terminal G of the P channel MOS transistor TR11 and the gate terminal G of the P channel MOS transistor TR12 to the power supply line AVD.

In parallel with this, the switching element SW2 is set to an off state (open state) to disconnect the drain terminal D of the P channel MOS transistor TR11 from the constant current source CC, and the switching element SW3 is set to the off state (open state) to disconnect the drain terminal D of the P channel MOS transistor TR12 from the source terminal S of the P channel MOS transistor TR15.

As a result of these operations, a current source supplying power to the preamplifier section 13 is disconnected to establish a state in which no steady-state current is passed.

Further, the switching elements SW4, SW5, and SW6 are set to the on state (closed state) to connect, to the ground line AVS, the source terminal S and drain terminal D of the P channel MOS transistor TR13 and the source terminal S and drain terminal D of the P channel MOS transistor TR15. At this time, the ground line AVS functions as ground, and the P channel MOS transistor TR13 and the P channel MOS transistor TR15, functioning as input transistors, are both connected to the ground and are thus set to the off state regardless of voltage of the gate terminal G.

Subsequently, the gate terminals G of the P channel MOS transistor TR14 and the P channel MOS transistor TR16 are each set to the power supply line AVD to set both the P channel MOS transistor TR14 and the P channel MOS transistor TR16 to the off state.

Further, the switching element SW9 is set to the off state (open state) to disconnect the drain terminal D of the P channel MOS transistor TR14 from the load resistor R1, and the switching element SW10 is set to the off state (open state) to disconnect the drain terminal D of the P channel MOS transistor TR16 from the load resistor R2, thus bringing the output of the preamplifier section 13 into a high impedance state.

Then, the switching element SW7 is set to the on state (closed state) to connect the gate terminal G of the P channel MOS transistor TR13 to one of the input terminals of the comparator section 14, and the switching element SW8 is set to the on state (closed state) to connect the gate terminal G of the P channel MOS transistor TR15 to the other input terminal of the comparator section 14, thus bringing the input and output of the preamplifier section 13 into a through state.

As a result of these operations, the comparator section 14 can be set being independently operative.

In other words, in the configuration described above, the preamplifier section 13 is powered down to cause the pixel signal SVX and the threshold voltage $S_{th}$ to bypass the preamplifier section 13 to input the pixel signal SVX and the threshold voltage $S_{th}$ directly to the comparator section 14.

As described above, according to the electronic equipment 100 of the present first embodiment, during a low pixel count when quantization errors and streaking characteristics are not high, the input and output of the preamplifier section 13 are bypassed to power down the preamplifier section 13, enabling a reduction in power consumption.

(2) Second Embodiment

Now, a second embodiment will be described.

An A/D converter 10A of the second embodiment differs from the A/D converter 10 of the first embodiment in that, with the preamplifier section 13 not bypassed, a reduction in power consumption is achieved by shortening an operating period of the preamplifier section 13.

Specifically, the A/D converter 10A of the second embodiment differs from the A/D converter 10 of the first embodiment in that a reduced number of A/D bits during a low pixel count (during a low bit mode) enables a reduction in the number of conversions by the converter in a case where a sequential comparison conversion scheme is used, leading to a shorter effective operating time during a low pixel count than during a high pixel count.

[Configuration Example of A/D Converter]

Figure 6:
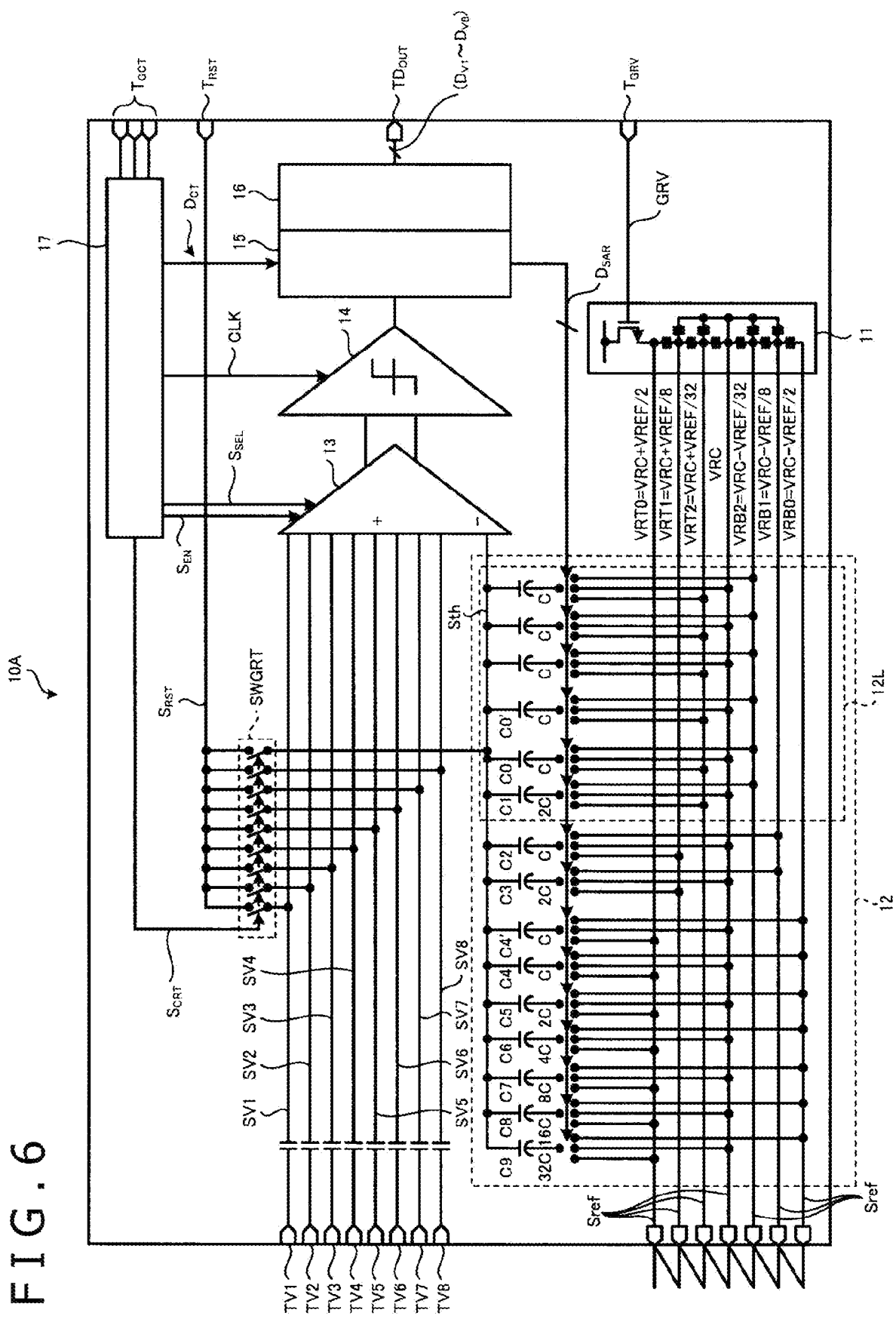
FIG. 6 is a diagram illustrating a configuration example of an A/D converter of a second embodiment.

FIG. 6 is a diagram illustrating a configuration example of the A/D converter of the second embodiment.

In FIG. 6, portions similar to the corresponding portions of the A/D converter 10 of the first embodiment in FIG. 2 are assigned the same reference signs, and the detailed description of the A/D converter 10 is incorporated here.

Being broadly classified into main components, the A/D converter 10A includes the local reference voltage generation section 11, the DA conversion section 12, the preamplifier section 13, the comparator section 14, the sequential conversion logic section 15, the column interface section 16, the clock generation/logic control block 17, and the reset switch group $SWG_{RT}$, as illustrated in FIG. 6.

In the configuration described above, the A/D converter 10A differs from the A/D converter 10 of the first embodiment in that an enable period (the period of an enable signal $S_{EN}$="H") provided for the preamplifier section 13 by the clock generation/logic control block 17 differs between the time of a high bit mode and the time of a low pixel mode and is shorter during the low pixel mode. The A/D converter 10A also differs from the A/D converter 10 of the first embodiment in that the number of CLKs to the comparator section 14 is reduced.

In addition, control logics $D_{SAR}$ from the sequential conversion logic section 15 to the DA conversion section 12 is also reduced by an amount equal to a reduction in the number of comparisons.

[Operations of A/D Converter of Second Embodiment]

Now, operations of the A/D converter of the second embodiment will be described with reference to the drawings.

Figure 7:
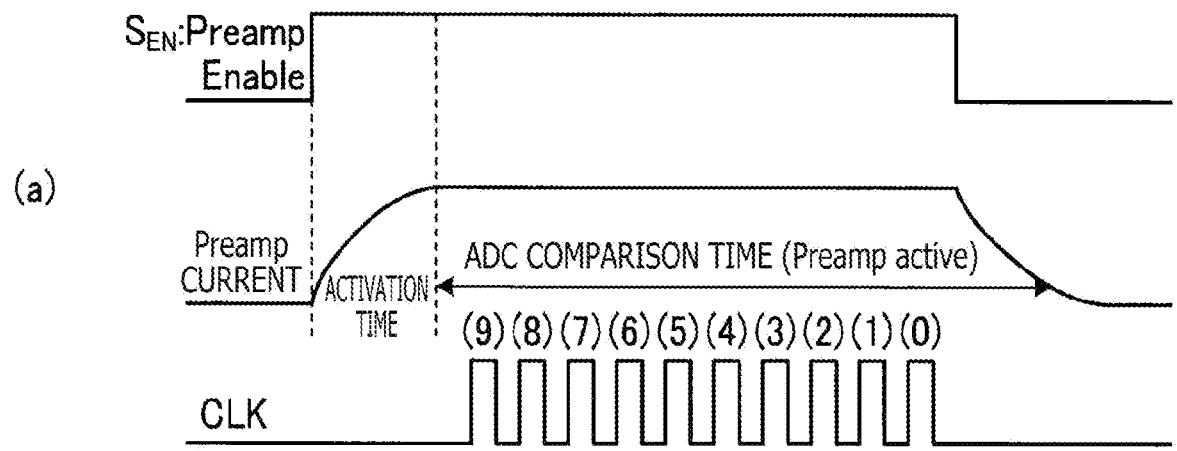
FIG. 7 depicts explanatory diagrams of operations of the second embodiment.
Figure 7:
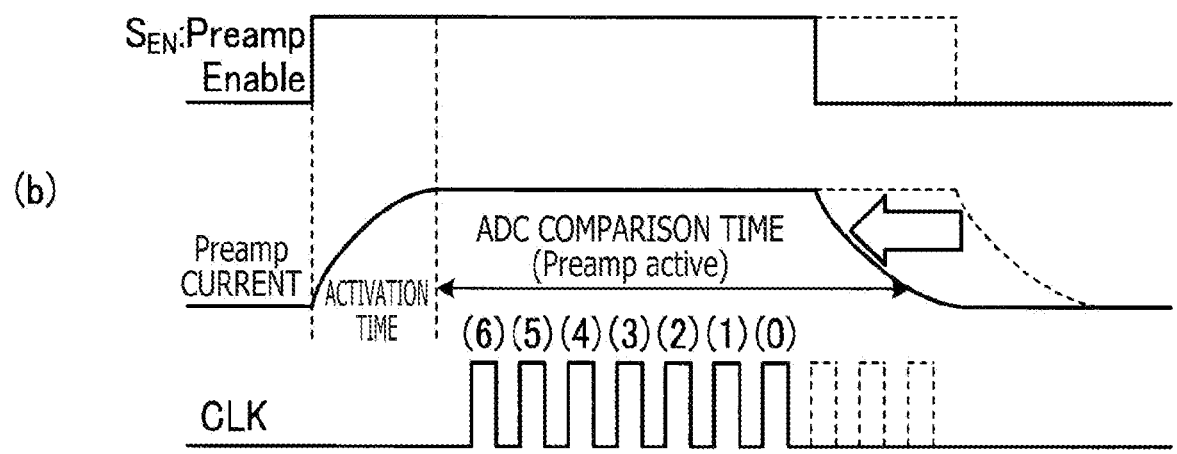

FIG. 7 depicts explanatory diagrams of operations of the second embodiment.

The second embodiment includes two operation modes, a high bit mode and a low pixel mode, which will be sequentially described. For simplified description, it is assumed that, in FIG. 7, the high bit mode is expressed by ten comparisons by the comparator section 14, whereas the low pixel mode is expressed by seven comparisons by the comparator section 14.

[During High Bit Mode]

FIG. 7(a) is an operation timing chart for the high bit mode.

First, operation during the high bit mode will be described.

During the high bit mode, as illustrated in FIG. 7(a), the enable signal $S_{EN}$="H" is set, and the preamplifier section 13 is activated, and then, the comparator section 14 performs ten comparisons, thus completing the A/D conversion. At that timing, the enable signal $S_{EN}$="L" is set, and the preamplifier section 13 enters the power down mode.

Consequently, in the high bit mode, the time for one conversion of a pixel signal equals the time for activation of the preamplifier+the time for ten comparisons by the comparator section 14.

[During Low Pixel Mode]

Now, operation during the low pixel mode will be described.

FIG. 7(b) is an operation timing chart for the low pixel mode.

During the high bit mode, as illustrated in FIG. 7(b), the enable signal $S_{EN}$="H" is set, and the preamplifier section 13 is activated, and then, the comparator section 14 performs seven comparisons, thus completing the A/D conversion. At that timing, the enable signal $S_{EN}$="L" is set, and the preamplifier section 13 enters the power down mode.

As described above, the low pixel mode enables a reduction in the number of comparisons performed by the comparator section 14, compared to the high bit mode. Thus, as indicated by a difference in FIG. 7(b) represented by solid lines (low pixel mode) and dashed lines (high bit mode), the operating period for the preamplifier section 13 can also be reduced, enabling a reduction in the power consumption in the preamplifier section 13.

(3) Third Embodiment

Now, a third embodiment will be described.

An A/D converter 10B of the third embodiment differs from the A/D converter 10 of the first embodiment in that the preamplifier section 13 is not bypassed and in that a pixel addition switch for adding n (n is a natural number of 2 or larger) pixel signals during a pixel addition mode is provided, with processing executed with n pixels considered to be one pixel, allowing the processing time to be effectively reduced to 1/n.

[Configuration Example of A/D Converter]

Figure 8:
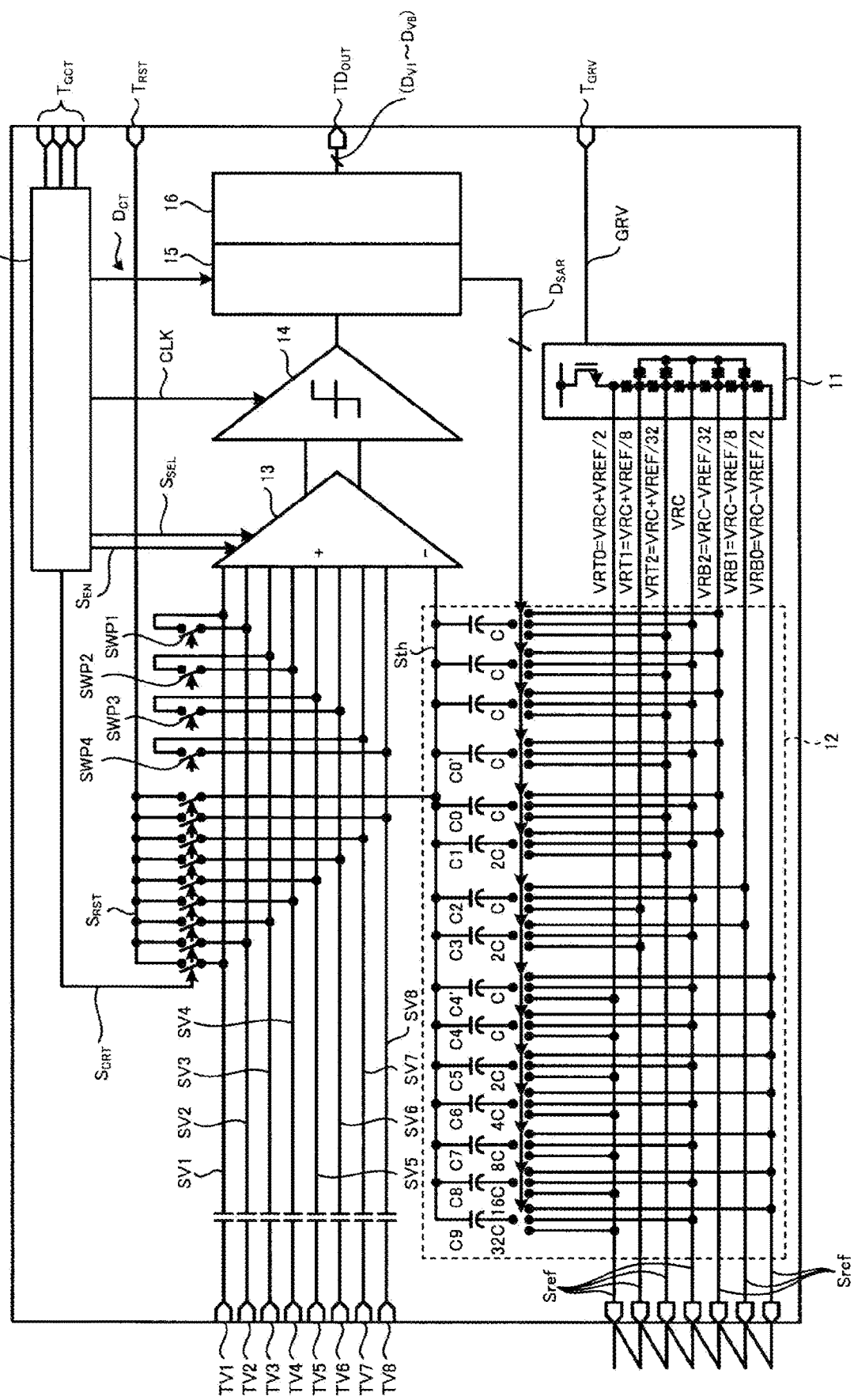
FIG. 8 is a diagram illustrating a configuration example of an A/D converter of a third embodiment.

FIG. 8 is a diagram illustrating a configuration example of the A/D converter of the third embodiment.

In FIG. 8, portions similar to the corresponding portions of the A/D converter 10 of the first embodiment in FIG. 2 are assigned the same reference signs, and the detailed description of the A/D converter 10 is incorporated here.

Being broadly classified into main components, the A/D converter 10B includes the local reference voltage generation section 11, the DA conversion section 12, the preamplifier section 13, the comparator section 14, the sequential conversion logic section 15, the column interface section 16, the clock generation/logic control block 17, pixel addition switches SWP1 to SWP4, and the reset switch group $SWG_{RT}$, as illustrated in FIG. 8.

In the configuration described above, each of the pixel addition switches SWP1 to SWP4 is intended to add corresponding two (corresponding to n=2) pixel signals together to allow the two pixel signals to be considered as one pixel signal for processing. The pixel addition switches SWP1 to SWP4 are controlled by the clock generation/logic control block 17.

More specifically, when set to the on state, the pixel addition switch SWP1 applies, to the input terminal of the preamplifier section 13 for the pixel signal SV1, an addition voltage of the voltage of the pixel signal SV1 and the voltage of the pixel signal SV2.

In addition, when set to the on state, the pixel addition switch SWP2 applies, to the input of the preamplifier section 13 for the pixel signal SV3, an addition voltage of the voltage of the pixel signal SV3 and the voltage of the pixel signal SV4.

In addition, when set to the on state, the pixel addition switch SWP3 applies, to the input terminal of the preamplifier section 13 for the pixel signal SV5, an addition voltage of the voltage of the pixel signal SV5 and the voltage of the pixel signal SV6.

In addition, when set to the on state, the pixel addition switch SWP4 applies, to the input of the preamplifier section 13 for the pixel signal SV7, an addition voltage of the voltage of the pixel signal SV7 and the voltage of the pixel signal SV8.

[Operations of A/D Converter of Third Embodiment]

Now, operations of an A/D converter of the third embodiment will be described with reference to the drawings.

Figure 9:
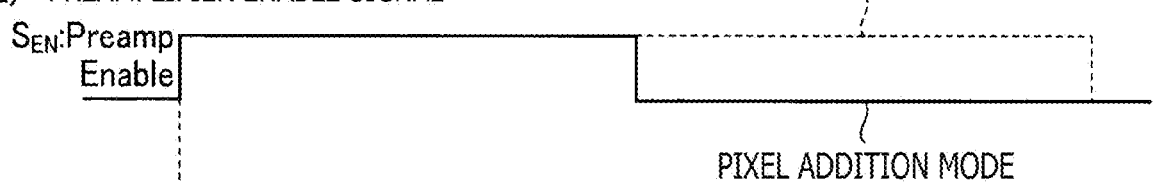
FIG. 9 depicts explanatory diagrams of operations of the third embodiment.
Figure 9:
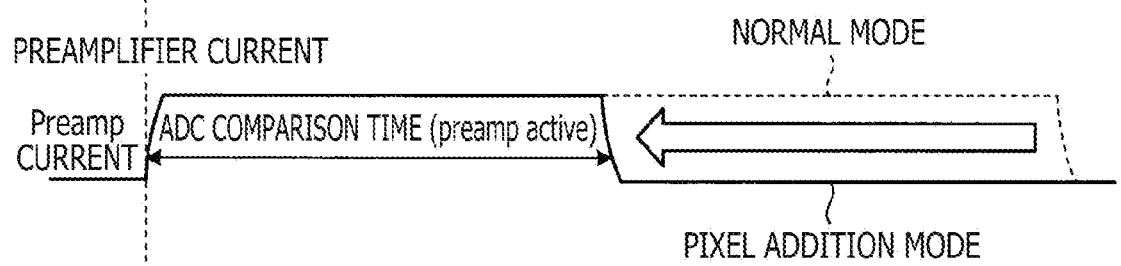
Figure 9:

FIG. 9 depicts explanatory diagrams illustrating operations of the third embodiment.

In FIG. 9 as well, the horizontal axis is a time axis.

In addition, the third embodiment includes two operation modes, the normal mode and a pixel addition mode, which will be sequentially described.

In this case, in the normal mode, A/D conversion processing is executed on the pixel signal in pixel units, whereas in the pixel addition node, A/D conversion processing is executed on the pixel signal in units of a plurality of pixels (in the third embodiment, two pixels).

[During Normal Mode]

First, operation during the normal mode will be described. A dashed portion of FIG. 9(a) indicates a timing chart of a preamplifier enable signal $S_{EN}$ in the normal mode, and FIG. 9(c) illustrates a timing chart of the clock signal CLK for A/D conversion processing of the third embodiment.

During the normal mode, as indicated by a dashed line in FIG. 9(a), when the enable signal $S_{EN}$="H" is set, the preamplifier section 13 is activated. Subsequently, eight AD conversions (ADC1 to ADC7) are performed, and the enable signal $S_{EN}$="L" is set to cause the preamplifier section 13 to enter the power down mode.

Consequently, in the normal mode, the preamplifier section 13 is activated during each of the eight AD periods ADC1 to ADC7.

[Pixel Addition Mode]

Now, operation during the pixel addition mode will be described.

FIGS. 9(a) and 9(b) are operation timing charts in which solid lines indicate the pixel addition mode.

During the pixel addition mode, all of the pixel addition switches SWP1 to SWP4 are in the on state.

As a result, the addition voltage of the voltage of the pixel signal SV1 and the voltage of the pixel signal SV2 is applied to the input terminal of the preamplifier section 13 for the pixel signal SV1, the addition voltage of the voltage of the pixel signal SV3 and the voltage of the pixel signal SV4 is applied to the input terminal of the preamplifier section 13 for the pixel signal SV3, the addition voltage of the voltage of the pixel signal SV5 and the voltage of the pixel signal SV6 is applied to the input terminal of the preamplifier section 13 for the pixel signal SV5, and the addition voltage of the voltage of the pixel signal SV7 and the voltage of the pixel signal SV8 is applied to the input terminal of the preamplifier section 13 for the pixel signal SV7.

During the pixel addition mode, in FIG. 9(a), when the enable signal $S_{EN}$="H" is set as indicated by a dashed line, the preamplifier section 13 is activated. Subsequently, four AD conversions (ADC1 to ADC4) are performed, and the enable signal $S_{EN}$="L" is set to cause the preamplifier section 13 to enter the power down mode.

Specifically, the pixel addition mode halves the number of AD conversions performed compared to the normal mode, and thus the number of activations of the preamplifier section 13 in the pixel addition mode is half the number of activations in the normal mode. Accordingly, the preamplifier section 13 operates for approximately half of the time for which the preamplifier section 13 operates in the normal mode, enabling halving (reduction) of the power consumption of the preamplifier section 13. Similarly, the power of the sequential conversion block can be halved (reduced).

As described above, in the pixel addition mode, four pixel data DV1, DV3, DV5, and DV7 corresponding to corresponding four addition voltages are output, enabling the processing time and power consumption to be reduced to approximately half of the processing time and power consumption in the normal mode.

In other words, according to the third embodiment, a plurality of pixels is grouped to allow n pixels to be considered as one pixel for processing. Thus, the processing time is effectively reduced to 1/n, and the power consumption is also reduced to approximately 1/n, leading to a reduction in the power consumption of the solid-state imaging device 1.

(4) Fourth Embodiment

Now, a fourth embodiment will be described.

An A/D converter 10C of the fourth embodiment differs from the A/D converter 10 of the first embodiment in that the preamplifier section 13 is not bypassed and in that, during the low pixel mode (low bit mode), one LSB has an increased value, leading to more significant quantization errors, and thus the linearity and noise characteristics of the preamplifier are moderated to reduce the power consumption.

[Configuration Example of A/D Converter]

Figure 10:
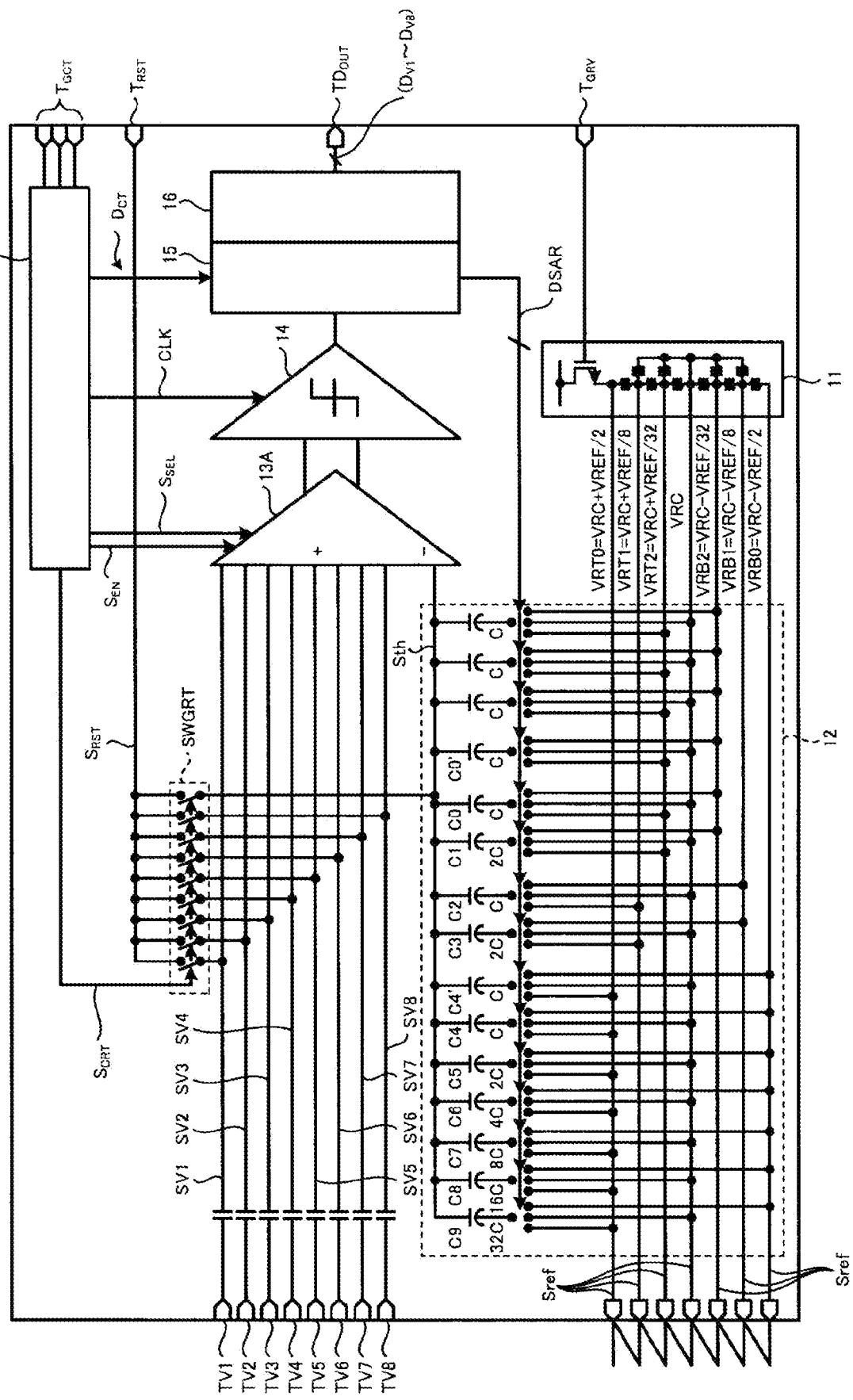
FIG. 10 is a diagram illustrating a configuration example of an A/D converter of a fourth embodiment.

FIG. 10 is a diagram illustrating a configuration example of an A/D converter of the fourth embodiment.

Being broadly classified into main components, an A/D converter 10C includes the local reference voltage generation section 11, the DA conversion section 12, the preamplifier section 13A, the comparator section 14, the sequential conversion logic section 15, the column interface section 16, the clock generation/logic control block 17, and the reset switch group $SWG_{RT}$ as illustrated in FIG. 10.

A configuration of the A/D converter 10C differs from the A/D converter 10 of the first embodiment in FIG. 2 in that the preamplifier through switch group $SWG_{TM}$ is not provided and that a preamplifier current supplied to the preamplifier section 13A can be reduced (for example, halved), and thus, the description of the other portions is incorporated here.

[Operations of A/D Converter of Fourth Embodiment]

Now, operations of an A/D converter of the fourth embodiment will be described with reference to FIG. 11.

Figure 11:
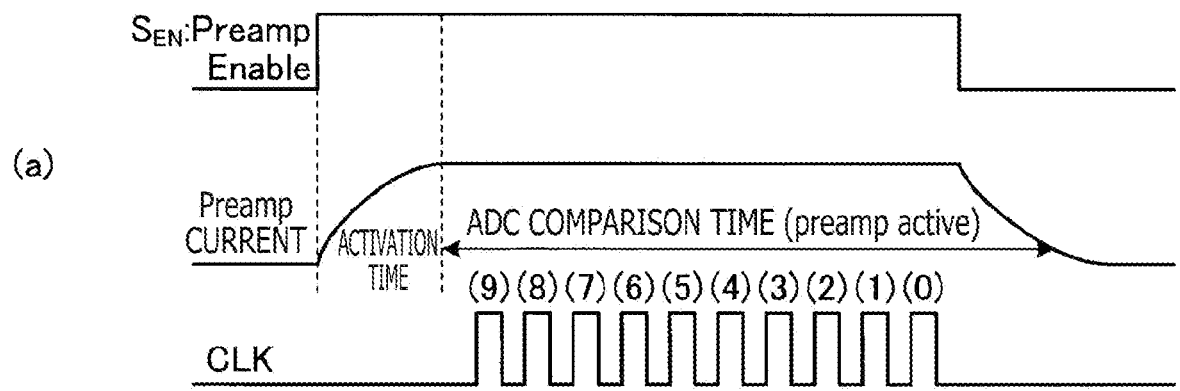
FIG. 11 depicts explanatory diagrams of operations of the fourth embodiment.
Figure 11:
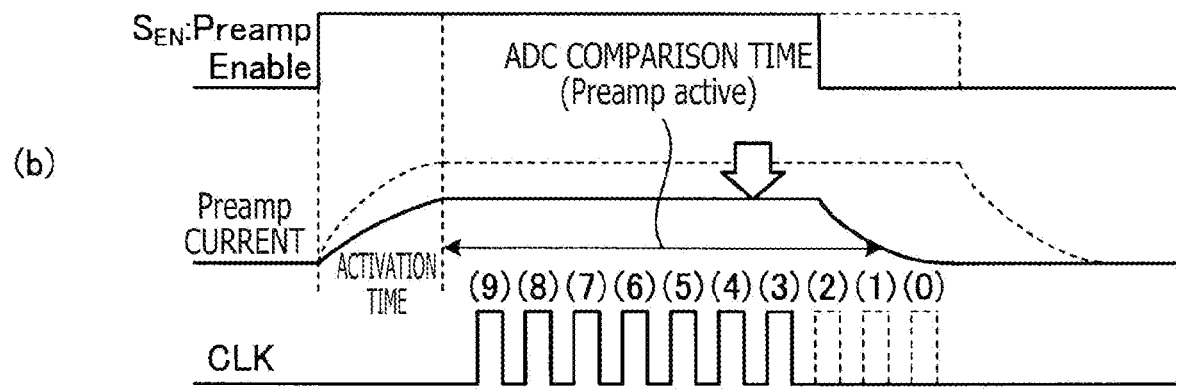

FIG. 11 depicts explanatory diagrams of operations of the fourth embodiment.

The fourth embodiment also includes two operation modes, the high bit mode and the low pixel mode, which will be sequentially described.

[During High Bit Mode]

FIG. 11(*a*) is a timing chart of the high bit mode.

First, operation during the high bit mode will be described.

During the high bit mode, as illustrated in FIG. 11(*a*), the enable signal $S_{EN}$="H" is set to activate the preamplifier section 13, and then, the comparator section 14 performs ten comparisons, completing an A/D conversion. At that timing, the enable signal $S_{EN}$="L" is set to cause the preamplifier section 13 to enter the power down mode.

[During Low Pixel Mode]

Now, operation during the low pixel mode will be described.

FIG. 11(*b*) is a timing chart of the low pixel mode.

In the low pixel mode, one LSB has an increased value, leading to more significant quantization errors, and thus, the linearity and noise characteristics required for the preamplifier are moderated. Consequently, the current in the preamplifier section 13 can be made lower than in the high bit mode.

In the low pixel mode, as illustrated in FIG. 11(*b*), when the enable signal $S_{EN}$="H" is set, the preamplifier section 13 is supplied with a low pixel mode current having a lower current value than the current in the state of the high bit mode.

During the low pixel mode, as illustrated in FIG. 11(*b*), the enable signal $S_{EN}$="H" is set to activate the preamplifier section 13, and then, the comparator section 14 performs ten comparisons, completing an A/D conversion. At that timing, the enable signal $S_{EN}$="L" is set to cause the preamplifier section 13 to enter the power down mode.

The low pixel mode differs from the high bit mode in that the current during activation of the preamplifier is lower than the current during the high bit mode. This enables the power consumption to be reduced.

As described above, according to the fourth embodiment, in the low pixel mode, one LSB has an increased value, leading to more significant quantization errors, and thus, the linearity and noise characteristics required for the preamplifier section 13 are moderated to reduce the preamplifier current flowing through the preamplifier section 13. This enables a reduction in the power consumption of the preamplifier section 13 and thus in the power consumption of the electronic equipment 100.

(5) Fifth Embodiment

Now, a fifth embodiment will be described.

Figure 12:
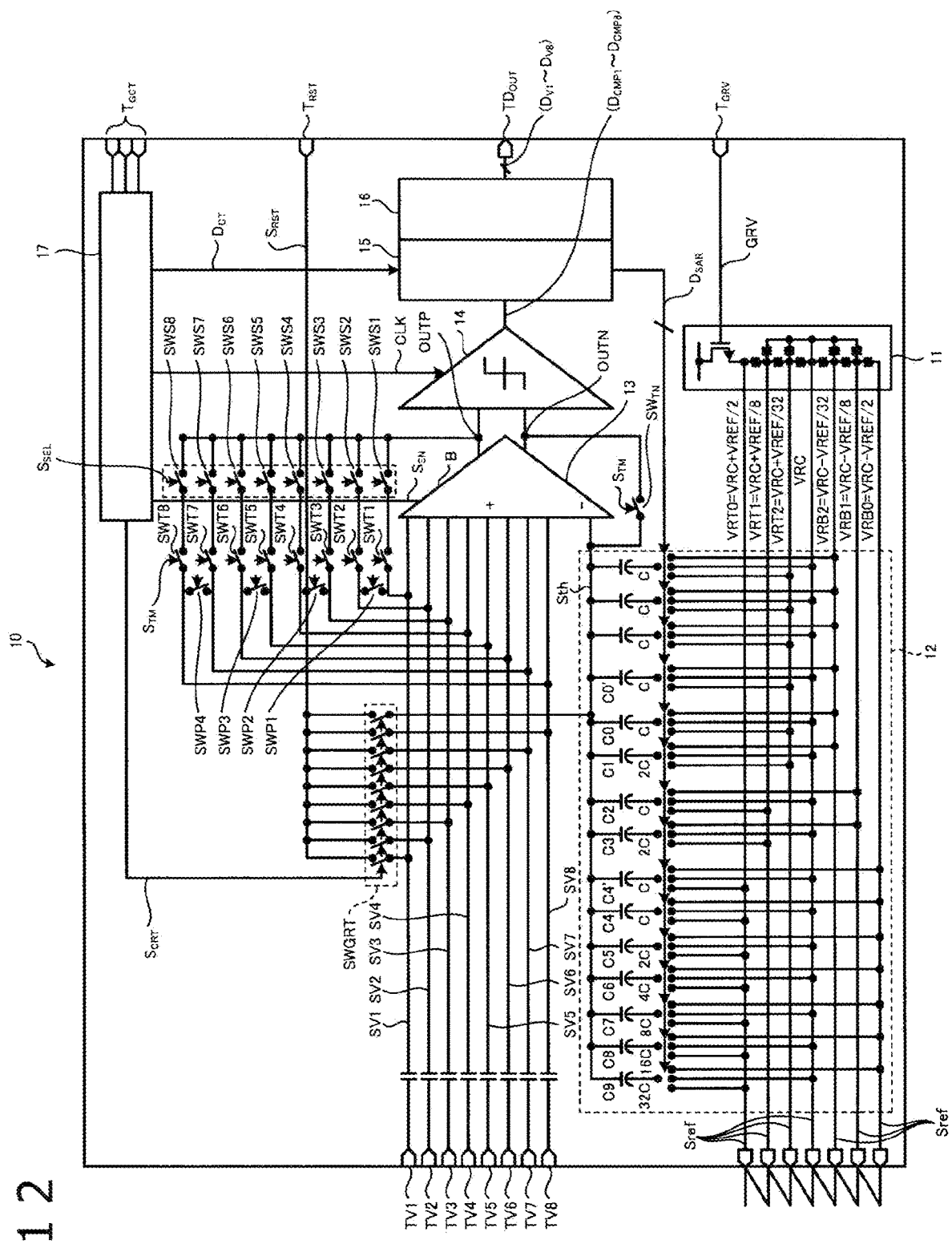
FIG. 12 is a diagram illustrating a configuration example of an A/D converter of a fifth embodiment.

FIG. 12 is a diagram illustrating a configuration example of an A/D converter of the fifth embodiment.

The fifth embodiment in FIG. 12 differs from the first embodiment in FIG. 2 in that the fifth embodiment includes the pixel addition switches SWP1 to SWP4. In other words, the fifth embodiment is a combination of the first embodiment and the third embodiment.

More specifically, the switching elements SWT1, SWS1 and SWT2 and SWS2 are provided to allow the pixel signals SV1 and SV2 to bypass the preamplifier. In addition, a switching element SWP1 is provided for pixel addition for the pixel signal SV1 to pixel signal SV2.

Similarly, the switching elements SWT3, SWS3 and SWT4 and SWS4 are provided to allow the pixel signals SV3 and SV4 to bypass the preamplifier. In addition, a switching element SWP2 is provided for pixel addition for the pixel signal SV3 to pixel signal SV4.

Further, the switching elements SWT5, SWS5 and SWT6 and SWS6 are provided to allow the pixel signals SV5 and SV6 to bypass the preamplifier. In addition, a switching element SWP3 is provided for pixel addition for the pixel signal SV5 to pixel signal SV6.

Still further, the switching elements SWT7, SWS7 and SWT8 and SWS8 are provided to allow the pixel signals SV7 and SV8 to bypass the preamplifier. In addition, a switching element SWP4 is provided for pixel addition for the pixel signal SV7 to pixel signal SV8.

According to the fifth embodiment, at the time of preamplifier through for the pixel signals SV1 to SV8 (when the pixel signals SV1 to SV8 bypass the preamplifier), transitioning to the power down mode occurs in which the preamplifier section 13 is set to a shutdown state, reducing the power consumption of the imaging device 1 and thus of the whole electronic equipment 100. In addition, in the pixel addition mode, four pixel data DV1, DV3, DV5, and DV7 are output that correspond to the pixel signals corresponding to corresponding four addition voltages, halving the processing time to enable the power consumption to be reduced to approximately half of the power consumption in the normal mode.

Specifically, according to the fifth embodiment, a plurality of pixels is grouped to allow n pixels to be considered as one pixel for processing. Thus, the processing time is effectively reduced to 1/n, and the power consumption is also reduced to approximately 1/n, leading to a further reduction in the power consumption of the solid-state imaging device 1.

(6) Sixth Embodiment

Now, a sixth embodiment will be described.

Figure 13:
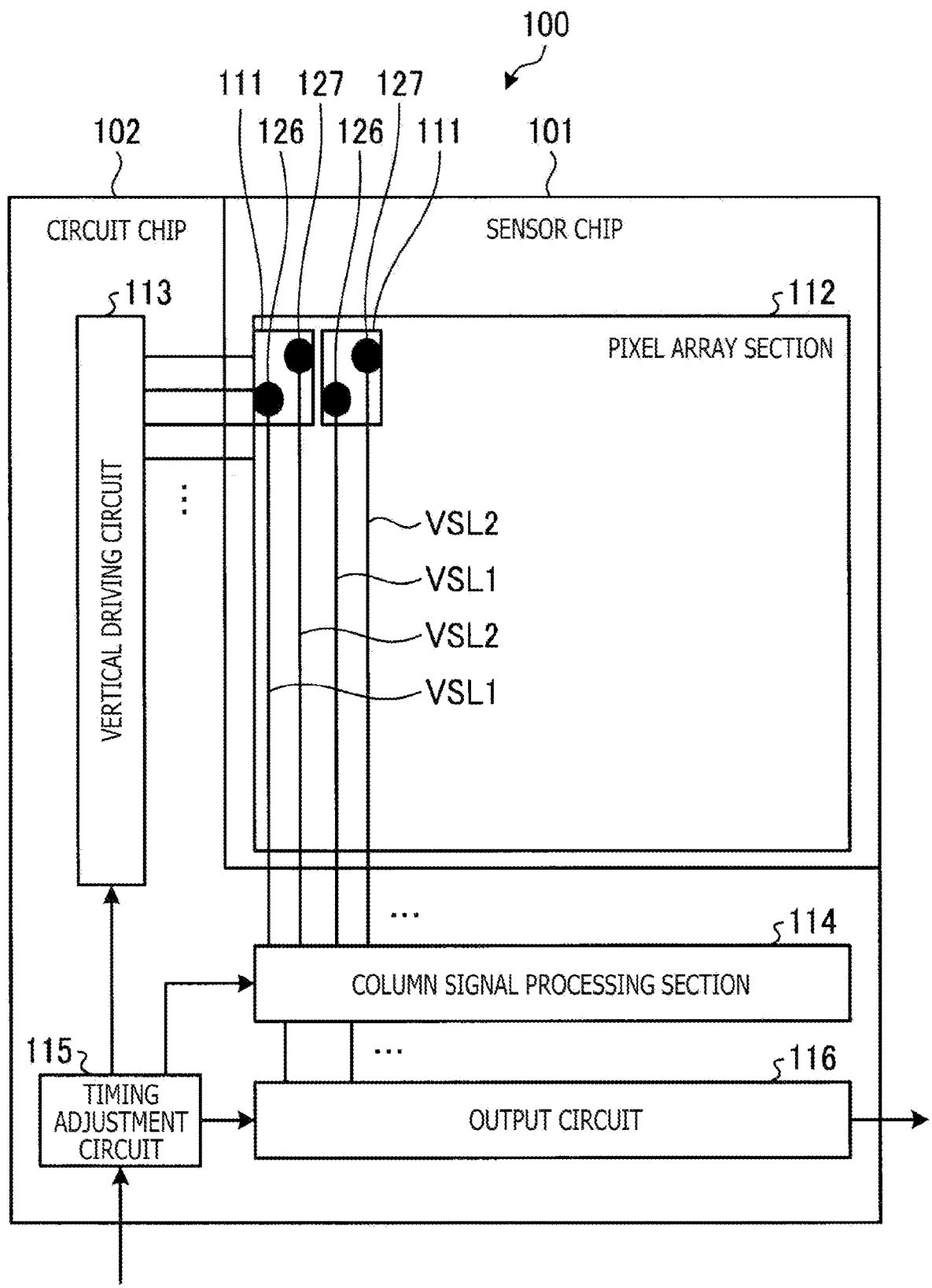
FIG. 13 is a block diagram of an example of an indirect-time of flight range sensor to which the present technique is applied.

FIG. 13 is a block diagram of an example of an indirect-time of flight range sensor to which the present technique is applied.

An indirect-time of flight range sensor 100 includes a sensor chip 101 and a circuit chip 102 stacked on the sensor chip 101.

A pixel array section 112 includes a plurality of pixels (pixel) 111 arranged on the sensor chip 101 in an array in a two-dimensional grid pattern. In this regard, the pixel array section 112 may be disposed on a matrix and may include a plurality of column signal lines. The column signal lines are connected to the respective pixels.

A vertical driving circuit 113, a column signal processing section 114, a timing adjustment circuit 115, and an output circuit 116 are disposed in the circuit chip 102.

The vertical driving circuit 113 is configured to drive the pixels and to output pixel signals to the column signal processing section 114.

The column signal processing section 114 performs A/D conversion processing on the input pixel signals and outputs, to the output circuit 116, pixel data resulting from the A/D conversion processing.

The output circuit 116 executes CDS (Correlated Double Sampling) processing and the like on the pixel data from the column signal processing section 114, and outputs the pixel data processed to the succeeding signal processing circuit.

The timing control circuit 115 is configured to control driving timings for each vertical driving circuit 113. The column signal processing section 114 and the output circuit 116 operate in synchronism with vertical synchronizing signals output by the timing control circuit 115.

Now, the pixels 111 constituting the pixel array section 112 will be described in detail.

Figure 14:
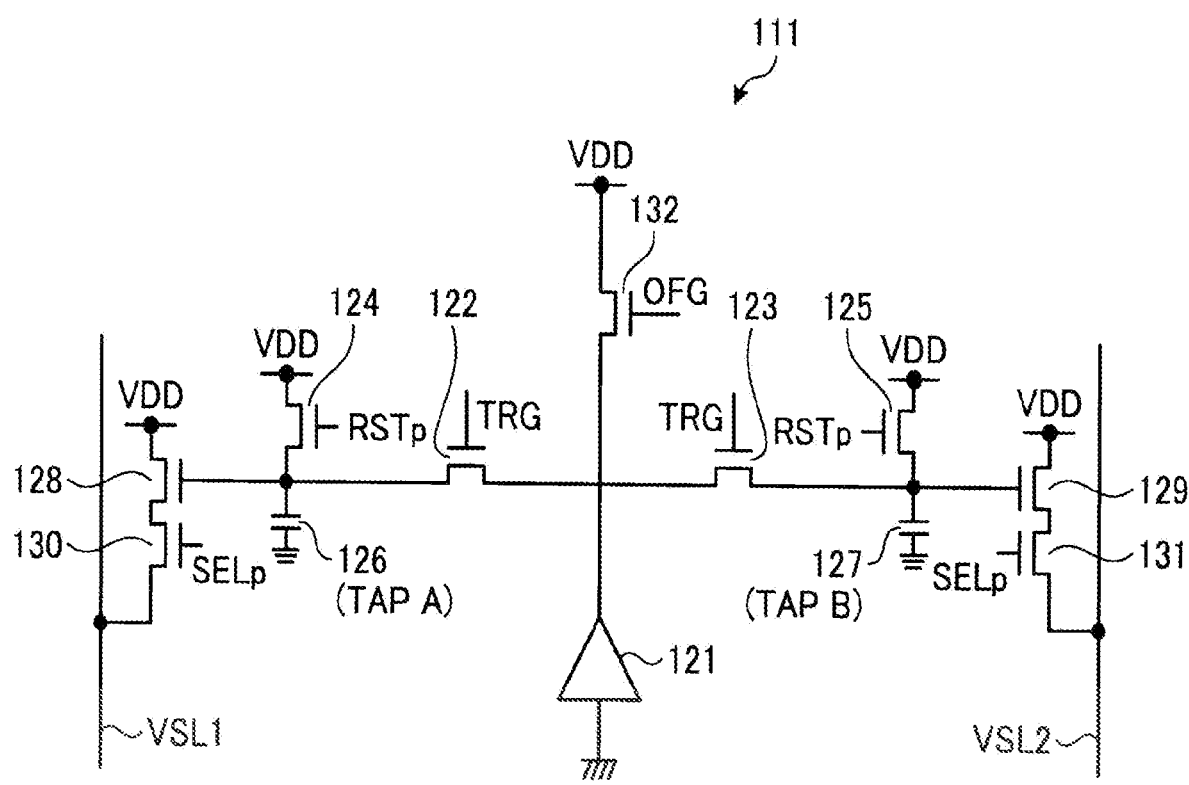
FIG. 14 is a circuit diagram illustrating a configuration example of a pixel in the present technique form.

FIG. 14 is a circuit diagram illustrating a configuration example of the pixel in the present technique form.

The pixel 111 includes a photodiode 121, two transfer transistors 122 and 123, two reset transistors 124 and 125, two taps (floating diffusion layers 126 and 127), two amplification transistors 128 and 129, and two selection transistors 130 and 131.

The photodiode 121 is intended to photoelectrically convert received light to generate charge. The photodiode 121 is disposed on a back surface of a semiconductor substrate that is opposite to a front surface on which a circuit is disposed. Such a solid-state imaging device is referred to as a back-illuminated solid-state imaging device. Note that instead of the back-illuminated configuration, a front-illuminated configuration can be used in which the photodiode 121 is disposed on a front surface.

The transfer transistor 122 and the transfer transistor 123 sequentially transfer charges from the photodiode 121 to each of the TAPA 126 and the TAPB 127 in accordance with transfer signals TRG from the vertical driving circuit 113. The TAPA 126 and the TAPB 127 are intended to accumulate transferred charges and to generate a voltage corresponding to the amount of charges accumulated.

An overflow transistor 132 is a transistor that sequentially discharges charges from the photodiode 121 to a high potential-side power supply VDD. The overflow transistor 132 includes a function to reset the photodiode 121.

The reset transistors 124 and 125 respectively draw charges from the TAPA 126 and the TAPB 127 in accordance with a reset signal RSTp from the vertical driving circuit 113 to initialize the amount of charges.

The amplification transistors 128 and 129 respectively amplify the voltages of the TAPA 126 and the TAPB 127. In accordance with a selection signal SELp from the vertical driving circuit 113, the selection transistors 130 and 131 output signals with amplified voltages to the column signal processing section 114 via two vertical signal lines (for example, VSL1 and VSL2). The vertical signal line and the vertical signal line VSL2 are connected to an input of one of the A/D converters 10 in the column signal processing section 114.

Note that the circuit configuration of the pixel 111 is not limited to the configuration illustrated in FIG. 15 as long as the circuit configuration can photoelectrically generate pixel signals.

According to the sixth embodiment, the indirect-time of flight range sensor can also reduce power consumption as is the case with each of the embodiments.

Note that the effects described herein are only illustrative and not restrictive and that any other effect may be produced.

Note that the present technique can also take the following configurations.

(1)

A solid-state imaging device including:

a pixel array section in which a plurality of pixels is disposed in an array, the plurality of pixels performing photoelectric conversion and outputting respective pixel signals;

a preamplifier section including respective input terminals to which the pixel signals and a threshold signal are input, the preamplifier section amplifying the pixel signals and the threshold signal and outputting the pixel signals and the threshold signal amplified from output terminals as first signals and a second signal, the preamplifier section being set to a shutdown state on the basis of a first control signal input;

a comparator section including first input terminals from which the first signals are input and a second input terminal from which the second signal is input, the comparator section performing comparisons of the first signals with the second signal and outputting comparison result data; and a preamplifier through circuit including a plurality of switching elements connecting the input terminals of the preamplifier section to the input terminals of the comparator section, the preamplifier through circuit setting the switching elements to a connection state on the basis of a second control signal input in the shutdown state.

(2)

The solid-state imaging device according to (1), in which the preamplifier through circuit includes a pair of switching elements provided on signal lines through which the input terminals of the preamplifier section are connected to the corresponding input terminals of the comparator section, and one switching element of the pair of switching elements is disposed in proximity to the input terminals of the preamplifier section, and another switching element is disposed in proximity to the input terminals of the comparator section.

(3)

The solid-state imaging device according to (1) or (2), in which the preamplifier section includes a plurality of second switching elements electrically disconnecting the preamplifier section from the pixel array section and the comparator section to transition the preamplifier section to the shutdown state in a case where the pixel signals and the threshold signal are output to the comparator section via the preamplifier through circuit.

(4)

The solid-state imaging device according to (3), in which the second switching elements set the preamplifier section to a high impedance state to electrically disconnect the preamplifier section.

(5)

The solid-state imaging device according to any one of (1) to (4), further including:

a sequential conversion block section determining, on the basis of the comparison result data, pixel data resulting from an A/D conversion of the pixel signals.

(6)

The solid-state imaging device according to any one of (1) to (5), in which the first control signal is input in a case where the solid-state imaging device is operated in a low pixel mode.

(7)

The solid-state imaging device according to any one of (1) to (6), further including:

a plurality of pixel addition switching elements connecting every n first input terminals of the plurality of first input terminals with each other and adding potentials of the n first input terminals connected with each other to obtain an addition potential.

(8)

A solid-state imaging device including:

a pixel array section in which a plurality of pixels is disposed in an array, the plurality of pixels performing photoelectric conversion and outputting respective pixel signals;

a preamplifier section including a plurality of input terminals corresponding to the pixel signals and to which the pixel signals are input and an input terminal corresponding to a threshold signal and to which the threshold signal is input, the preamplifier section amplifying the pixel signals and the threshold signal and outputting the pixel signals and the threshold signal amplified from corresponding output terminals as a plurality of first signals and a second signal, respectively;

a comparator section including first input terminals from which the first signals are input and a second input terminal from which the second signal is input, the comparator section performing comparisons of the first signals with the second signal and outputting comparison result data; and a plurality of pixel addition switching elements connecting every n first input terminals of the plurality of first input terminals with each other and adding potentials of the n first input terminals connected with each other to obtain an addition potential.

(9)

A solid-state imaging device including:

a pixel array section in which a plurality of pixels is disposed in an array, the plurality of pixels performing photoelectric conversion and outputting respective pixel signals;

a preamplifier section including a plurality of input terminals corresponding to the pixel signals and to which the pixel signals are input and an input terminal corresponding to a threshold signal and to which the threshold signal is input, the preamplifier section amplifying the pixel signals and the threshold signal and outputting the pixel signals and the threshold signal amplified from corresponding output terminals as first signals and a second signal, respectively; and a comparator section including first input terminals from which the first signals are input and a second input terminal from which the second signal is input, the comparator section performing comparisons of the first signals with the second signal and outputting comparison result data, in which, on the basis of a control signal input, a preamplifier current flowing through the preamplifier section is reduced under a use condition that enables linearity and noise characteristics for the preamplifier section to be moderated.

(10)

A solid-state imaging device including:

a pixel array section in which a plurality of pixels is disposed in an array, the plurality of pixels performing photoelectric conversion and outputting respective pixel signals;

a preamplifier section including a plurality of input terminals corresponding to the pixel signals and to which the pixel signals are input and an input terminal corresponding to a threshold signal and to which the threshold signal is input, the preamplifier section amplifying the pixel signals and the threshold signal and outputting the pixel signals and the threshold signal amplified from corresponding output terminals as first signals and a second signal, respectively;

a comparator section including first input terminals from which the first signals are input and a second input terminal from which the second signal is input, the comparator section performing comparisons of the first signals with the second signal and outputting comparison result data; and a sequential conversion block section determining, on the basis of the comparison result data, pixel data resulting from an A/D conversion of the pixel signals, in which the comparator section performs the comparisons on the basis of a control signal input and reduces the number of the comparisons on the basis of the control signal in a case where accuracy of the pixel data is not required.

(11)

Electronic equipment including:

a solid-state imaging device outputting a plurality of pieces of pixel data;

an image processing section executing image processing on image data corresponding to the plurality of pieces of pixel data; and a control section controlling the solid-state imaging device and the image processing section, the solid-state imaging device including a pixel array section in which a plurality of pixels is disposed in an array, the plurality of pixels performing photoelectric conversion and outputting respective pixel signals, a preamplifier section including respective input terminals to which the pixel signals and a threshold signal are input, the preamplifier section amplifying the pixel signals and the threshold signal and outputting the pixel signals and the threshold signal amplified from output terminals as first signals and a second signal, the preamplifier section being set to a shutdown state on the basis of a first control signal input, a comparator section including first input terminals from which the first signals are input and a second input terminal from which the second signal is input, the comparator section performing comparisons of the first signals with the second signal and outputting comparison result data, and a preamplifier through circuit including a plurality of switching elements connecting the input terminals of the preamplifier section to the input terminals of the comparator section, the preamplifier through circuit setting the switching elements to a connection state on the basis of a second control signal input in the shutdown state.

(12)

Electronic equipment including:

a solid-state imaging device outputting a plurality of pieces of pixel data;

an image processing section executing image processing on image data corresponding to the plurality of pieces of pixel data; and a control section controlling the solid-state imaging device and the image processing section, the solid-state imaging device including a pixel array section in which a plurality of pixels is disposed in an array, the plurality of pixels performing photoelectric conversion and outputting respective pixel signals, a preamplifier section including a plurality of input terminals to which the respective pixel signals are input and an input terminal to which the threshold signal is input, the preamplifier section amplifying the pixel signals and the threshold signal and outputting the pixel signals and the threshold signal amplified from corresponding output terminals as first signals and a second signal, a comparator section including first input terminals from which the first signals are input and a second input terminal from which the second signal is input, the comparator section performing comparisons of the first signals with the second signal and outputting comparison result data, and a plurality of pixel addition switching elements connecting every n first input terminals of the plurality of first input terminals with each other and adding potentials of the n first input terminals connected with each other to obtain an addition potential.

(13)

Electronic equipment including:

a solid-state imaging device outputting a plurality of pieces of pixel data;

an image processing section executing image processing on image data corresponding to the plurality of pieces of pixel data; and a control section controlling the solid-state imaging device and the image processing section, the solid-state imaging device including a pixel array section in which a plurality of pixels is disposed in an array, the plurality of pixels performing photoelectric conversion and outputting respective pixel signals, a preamplifier section including a plurality of input terminals to which the respective pixel signals are input and an input terminal to which the threshold signal is input, the preamplifier section amplifying the pixel signals and the threshold signal and outputting the pixel signals and the threshold signal amplified from corresponding output terminals as first signals and a second signal, and a comparator section including first input terminals from which the first signals are input and a second input terminal from which the second signal is input, the comparator section performing comparisons of the first signals with the second signal and outputting comparison result data, in which, on the basis of a control signal input, a preamplifier current flowing through the preamplifier section is reduced under a use condition that enables linearity and noise characteristics for the preamplifier section to be moderated.

(14)

The electronic equipment according to (13), in which the solid-state imaging device includes a preamplifier through circuit including a plurality of switching elements connecting the input terminals of the preamplifier section to the corresponding input terminals of the comparator section on the basis of a control signal input.

(15)

Electronic equipment including:

a solid-state imaging device outputting a plurality of pieces of pixel data, an image processing section executing image processing on image data corresponding to the plurality of pieces of pixel data, and a control section controlling the solid-state imaging device and the image processing section, the solid-state imaging device including a pixel array section in which a plurality of pixels is disposed in an array, the plurality of pixels performing photoelectric conversion and outputting respective pixel signals, a preamplifier section including a plurality of input terminals corresponding to the pixel signals and to which the pixel signals are input and an input terminal corresponding to a threshold signal and to which the threshold signal is input, the preamplifier section amplifying the pixel signals and the threshold signal and outputting the pixel signals and the threshold signal amplified from corresponding output terminals as first signals and a second signal, respectively, and a comparator section including first input terminals from which the first signals are input and a second input terminal from which the second signal is input, the comparator section performing comparisons of the first signals with the second signal and outputting comparison result data, in which, on the basis of a control signal input, a preamplifier current flowing through the preamplifier section is reduced under a use condition that enables linearity and noise characteristics for the preamplifier section to be moderated.

(16)

An A/D converter including:

a preamplifier section including respective input terminals to which the pixel signals and a threshold signal are input, the preamplifier section amplifying the pixel signals and the threshold signal and outputting the pixel signals and the threshold signal amplified from output terminals as first signals and a second signal, the preamplifier section being set to a shutdown state on the basis of a first control signal input;

a comparator section including first input terminals from which the first signals are input and a second input terminal from which the second signal is input, the comparator section performing comparisons of the first signals with the second signal and outputting comparison result data;

a preamplifier through circuit including a plurality of switching elements connecting the input terminals of the preamplifier section to the input terminals of the comparator section, the preamplifier through circuit setting the switching elements to a connection state on the basis of a second control signal input in the shutdown state; and a sequential conversion block section determining A/D conversion result data of the first input signals on the basis of the comparison result data.

(17)

The A/D converter according to (16), in which the preamplifier through circuit includes a pair of switching elements provided on signal lines through which the input terminals of the preamplifier section are connected to the corresponding input terminals of the comparator section, and one switching element of the pair of switching elements is disposed in proximity to the input terminals of the preamplifier section, and another switching element is disposed in proximity to the corresponding input terminals of the comparator section.

(18)

The A/D converter according to (16) or (17), in which the preamplifier section includes a plurality of second switching elements electrically disconnecting the preamplifier section from the pixel array section and the comparator section to transition the preamplifier section to the shutdown state in a case where the pixel signals and the threshold signal are output to the comparator section via the preamplifier through circuit.

(19)

The A/D converter according to any one of (16) to (18), in which the second switching elements set the preamplifier section to a high impedance state to electrically disconnect the preamplifier section.

REFERENCE SIGNS LIST

2: Pixel array section
4: A/D conversion section
8: Image processing section
9: Control section
10: A/D converter
11: Local reference voltage generation section
12: DA conversion section
13, 13A: Preamplifier section
14: Comparator section
15: Sequential conversion logic section
DA: Differential amplifier
SV1 to SV8: Pixel signals
$S_{EV}$: Determination result signal
SEL1 to SEL8: Pixel selection signals (second control signals)
$S_{EN}$: Enable signal (first control signal)
$S_{TM}$: Through mode control signal (second control signal)
SW1 to SW10: Switching elements (second switching elements)
SWT1 to SWT8: Switching elements

The invention claimed is:

1. A solid-state imaging device comprising:
a pixel array section in which a plurality of pixels is disposed in an array, the plurality of pixels performing photoelectric conversion and outputting respective pixel signals;
a preamplifier section including respective input terminals to which the pixel signals and a threshold signal are input, the preamplifier section amplifying differences between the pixel signals and the threshold signal and outputting the amplified differences as differential signals, the preamplifier section being set to a shutdown state on a basis of a first control signal input;
a comparator section comparing the differential signals with a comparison reference signal and outputting comparison result data; and
a preamplifier through circuit including a plurality of switching elements connecting the input terminals of the preamplifier section to input terminals of the comparator section, the preamplifier through circuit setting the switching elements to a connection state on a basis of a second control signal input in the shutdown state.

2. The solid-state imaging device according to claim 1, wherein the preamplifier through circuit includes a pair of switching elements provided on signal lines through which the input terminals of the preamplifier section are connected to the corresponding input terminals of the comparator section, and
one switching element of the pair of switching elements is disposed in proximity to the input terminals of the preamplifier section, and another switching element is disposed in proximity to the input terminals of the comparator section.

3. The solid-state imaging device according to claim 1, wherein the preamplifier section includes a plurality of second switching elements electrically disconnecting the preamplifier section from the pixel array section and the comparator section to transition the preamplifier section to the shutdown state in a case where the pixel signals and the threshold signal are output to the comparator section via the preamplifier through circuit.

4. The solid-state imaging device according to claim 3, wherein the second switching elements set the preamplifier section to a high impedance state to electrically disconnect the preamplifier section.

5. The solid-state imaging device according to claim 1, further comprising:
a sequential conversion block section determining, on a basis of the comparison result data, pixel data resulting from an A/D conversion of the pixel signals.

6. The solid-state imaging device according to claim 1, wherein the first control signal is input in a case where the solid-state imaging device is operated in a low pixel mode.

7. A solid-state imaging device comprising:
a pixel array section in which a plurality of pixels is disposed in an array, the plurality of pixels performing photoelectric conversion and outputting respective pixel signals;
a preamplifier section including a plurality of input terminals corresponding to the pixel signals and to which the pixel signals are input and an input terminal corresponding to a threshold signal and to which the threshold signal is input, the preamplifier section amplifying a plurality of the pixel signals and the threshold signal and outputting the plurality of pixel signals and the threshold signal amplified from corresponding output terminals as a plurality of first signals and a second signal, respectively;
a comparator section including a plurality of first input terminals from which a plurality of the first signals is input and a second input terminal from which the second signal is input, the comparator section performing comparisons of the first signals with the second signal and outputting comparison result data; and
a plurality of pixel addition switching elements connecting every n first input terminals of the plurality of first input terminals with each other and adding potentials of the n first input terminals connected with each other to obtain an addition potential.

8. A solid-state imaging device comprising:
a pixel array section in which a plurality of pixels is disposed in an array, the plurality of pixels performing photoelectric conversion and outputting respective pixel signals;
a preamplifier section including a plurality of input terminals corresponding to the pixel signals and to which the pixel signals are input and an input terminal corresponding to a threshold signal and to which the threshold signal is input, the preamplifier section amplifying the pixel signals and the threshold signal and outputting the pixel signals and the threshold signal amplified from corresponding output terminals as first signals and a second signal, respectively; and
a comparator section including first input terminals from which the first signals are input and a second input terminal from which the second signal is input, the comparator section performing comparisons of the first signals with the second signal and outputting comparison result data,
wherein, on a basis of a control signal input, a preamplifier current flowing through the preamplifier section is reduced under a use condition that enables linearity and noise characteristics for the preamplifier section to be moderated.

9. A solid-state imaging device comprising:
a pixel array section in which a plurality of pixels is disposed in an array, the plurality of pixels performing photoelectric conversion and outputting respective pixel signals;
a preamplifier section including a plurality of input terminals corresponding to the pixel signals and to which the pixel signals are input and an input terminal corresponding to a threshold signal and to which the threshold signal is input, the preamplifier section amplifying the pixel signals and the threshold signal and outputting the pixel signals and the threshold signal amplified from corresponding output terminals as first signals and a second signal, respectively;
a comparator section including first input terminals from which the first signals are input and a second input terminal from which the second signal is input, the comparator section performing comparisons of the first signals with the second signal and outputting comparison result data; and
a sequential conversion block section determining, on a basis of the comparison result data, pixel data resulting from an A/D conversion of the pixel signals,
wherein the comparator section performs the comparisons on a basis of a control signal input and reduces the number of the comparisons on the basis of the control signal in a case where accuracy of the pixel data is not required.

10. Electronic equipment comprising:
a solid-state imaging device outputting a plurality of pieces of pixel data;
an image processing section executing image processing on image data corresponding to the plurality of pieces of pixel data; and
a control section controlling the solid-state imaging device and the image processing section,
the solid-state imaging device including
a pixel array section in which a plurality of pixels is disposed in an array, the plurality of pixels performing photoelectric conversion and outputting respective pixel signals,
a preamplifier section including respective input terminals to which the pixel signals and a threshold signal are input, the preamplifier section amplifying the pixel signals and the threshold signal and outputting the pixel signals and the threshold signal amplified from output terminals as first signals and a second signal, the preamplifier section being set to a shutdown state on a basis of a first control signal input,
a comparator section including first input terminals from which the first signals are input and a second input terminal from which the second signal is input, the comparator section performing comparisons of the first signals with the second signal and outputting comparison result data, and
a preamplifier through circuit including a plurality of switching elements connecting the input terminals of the preamplifier section to the input terminals of the comparator section, the preamplifier through circuit setting the switching elements to a connection state on a basis of a second control signal input in the shutdown state.

11. Electronic equipment comprising:
a solid-state imaging device outputting a plurality of pieces of pixel data;
an image processing section executing image processing on image data corresponding to the plurality of pieces of pixel data; and
a control section controlling the solid-state imaging device and the image processing section,
the solid-state imaging device including
a pixel array section in which a plurality of pixels is disposed in an array, the plurality of pixels performing photoelectric conversion and outputting respective pixel signals,
a preamplifier section including a plurality of input terminals to which the respective pixel signals are input and an input terminal to which the threshold signal is input, the preamplifier section amplifying the pixel signals and the threshold signal and outputting the pixel signals and the threshold signal amplified from corresponding output terminals as first signals and a second signal,
a comparator section including first input terminals from which the first signals are input and a second input terminal from which the second signal is input, the comparator section performing comparisons of the first signals with the second signal and outputting comparison result data, and
a plurality of pixel addition switching elements connecting every n first input terminals of a plurality of the first input terminals with each other and adding potentials of the n first input terminals connected with each other to obtain an addition potential.

12. Electronic equipment comprising:
a solid-state imaging device outputting a plurality of pieces of pixel data;
an image processing section executing image processing on image data corresponding to the plurality of pieces of pixel data; and
a control section controlling the solid-state imaging device and the image processing section,
the solid-state imaging device including a pixel array section in which a plurality of pixels is disposed in an array, the plurality of pixels performing photoelectric conversion and outputting respective pixel signals, a preamplifier section including a plurality of input terminals to which the respective pixel signals are input and an input terminal to which the threshold signal is input, the preamplifier section amplifying the pixel signals and the threshold signal and outputting the pixel signals and the threshold signal amplified from corresponding output terminals as first signals and a second signal, and a comparator section including first input terminals from which the first signals are input and a second input terminal from which the second signal is input, the comparator section performing comparisons of the first signals with the second signal and outputting comparison result data, wherein, on a basis of a control signal input, a preamplifier current flowing through the preamplifier section is reduced under a use condition that enables linearity and noise characteristics for the preamplifier section to be moderated.

* * * * *